United States Patent
Mano

(10) Patent No.: US 11,215,479 B2
(45) Date of Patent: Jan. 4, 2022

(54) MAGNETIC SENSOR, SEMICONDUCTOR DEVICE, AND ELECTRIC DEVICE

(71) Applicant: Rohm Co., Ltd., Kyoto (JP)

(72) Inventor: Tatsuya Mano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 307 days.

(21) Appl. No.: 16/224,152

(22) Filed: Dec. 18, 2018

(65) Prior Publication Data

US 2019/0195661 A1 Jun. 27, 2019

(30) Foreign Application Priority Data

Dec. 22, 2017 (JP) .............................. JP2017-246325

(51) Int. Cl.
  *G01D 5/244* (2006.01)
  *G01R 33/06* (2006.01)
  *G01D 5/14* (2006.01)

(52) U.S. Cl.
  CPC ......... *G01D 5/24476* (2013.01); *G01D 5/145* (2013.01); *G01R 33/06* (2013.01)

(58) Field of Classification Search
  CPC ..... G01R 33/07; G01D 5/24476; G01D 5/145
  See application file for complete search history.

(56) References Cited

U.S. PATENT DOCUMENTS 6,169,398 B1  1/2001  Watanabe et al.
8,283,919 B2 * 10/2012  Yano .................... G01R 33/072
                                                       324/247
8,502,526 B2 *  8/2013  Nishikawa ............. G01R 33/07
                                                       324/207.2
9,178,445 B2 * 11/2015  Hara .................... H02M 7/5395
10,466,075 B2 * 11/2019  Tatenuma ............ G01D 5/2451
2003/0205996 A1 11/2003  Hara et al.
2004/0130317 A1  7/2004  Hatanaka
(Continued)

FOREIGN PATENT DOCUMENTS

CN       101359039       2/2009
CN       101777899       7/2010
(Continued)

OTHER PUBLICATIONS

The State Intellectual Property Office of People's Republic of China, Office Action in Chinese Appln. No. 201811564446.1, dated Dec. 11, 2020, 14 pages (with Machine Translation).

*Primary Examiner* — Elias Desta
(74) *Attorney, Agent, or Firm* — Fish & Richardson P.C.

(57) ABSTRACT

A magnetic sensor detects presence or absence of a magnetic field and its polarity. South pole and north pole magnetic fields are respectively detected by the south pole detection operation and the north pole detection operation. A signal processing circuit of the magnetic sensor performs a unit operation including at least one of the south pole detection operation and the north pole detection operation repeatedly at an interval. In this case, if the south pole is detected in the i-th unit operation, the south pole detection operation is performed first in the (i+1)th unit operation. If the south pole is detected in the south pole detection operation, the north pole detection operation is not performed in the unit operation. If the north pole is detected in the i-th unit operation, operations are performed oppositely to the above.

17 Claims, 18 Drawing Sheets

(56) References Cited

U.S. PATENT DOCUMENTS

| | | |
|---|---|---|
| 2004/0196033 A1 | 10/2004 | Hara et al. |
| 2004/0196034 A1 | 10/2004 | Hara et al. |
| 2008/0048772 A1 | 2/2008 | Nishikawa |
| 2008/0197834 A1 | 8/2008 | Takeda |
| 2009/0033324 A1 | 2/2009 | Tomida et al. |
| 2009/0174401 A1 | 7/2009 | Takeda |
| 2010/0026281 A1 | 2/2010 | Nishikawa |
| 2010/0308815 A1 | 12/2010 | Muraoka et al. |
| 2011/0241662 A1 | 10/2011 | Muraoka et al. |
| 2013/0076350 A1 | 3/2013 | Muraoka et al. |
| 2015/0042194 A1 | 2/2015 | Li et al. |
| 2016/0043666 A1 | 2/2016 | Li et al. |
| 2016/0043672 A1 | 2/2016 | Li et al. |
| 2016/0315508 A1 | 10/2016 | Li et al. |
| 2016/0341571 A1 | 11/2016 | Sun et al. |
| 2016/0344311 A1 | 11/2016 | Sun et al. |
| 2016/0344315 A1 | 11/2016 | Sun et al. |
| 2016/0344316 A1 | 11/2016 | Sun et al. |
| 2016/0344317 A1 | 11/2016 | Cai et al. |
| 2016/0344318 A1 | 11/2016 | Sun et al. |
| 2016/0344319 A1 | 11/2016 | Sun et al. |
| 2016/0344320 A1 | 11/2016 | Sun et al. |
| 2016/0344321 A1 | 11/2016 | Sun et al. |
| 2016/0344322 A1 | 11/2016 | Sun et al. |
| 2016/0344323 A1 | 11/2016 | Sun et al. |
| 2016/0349083 A1 | 12/2016 | Guo et al. |
| 2016/0352188 A1 | 12/2016 | Sun et al. |
| 2016/0352204 A1 | 12/2016 | Li et al. |
| 2016/0352263 A1 | 12/2016 | Guo et al. |
| 2016/0352264 A1 | 12/2016 | Sun et al. |
| 2016/0352265 A1 | 12/2016 | Guo et al. |
| 2016/0352266 A1 | 12/2016 | Sun et al. |
| 2016/0352267 A1 | 12/2016 | Sun et al. |
| 2016/0352268 A1 | 12/2016 | Sun et al. |
| 2016/0359395 A1 | 12/2016 | Sun et al. |
| 2016/0359439 A1 | 12/2016 | Sun et al. |
| 2016/0365756 A1 | 12/2016 | Li et al. |
| 2016/0365757 A1 | 12/2016 | Li et al. |
| 2016/0365781 A1 | 12/2016 | Li et al. |
| 2016/0365782 A1 | 12/2016 | Li et al. |
| 2017/0005605 A1 | 1/2017 | Sun et al. |
| 2017/0063180 A1 | 3/2017 | Li et al. |
| 2017/0063208 A1 | 3/2017 | Li et al. |
| 2017/0149311 A1 | 5/2017 | Li et al. |
| 2017/0149312 A1 | 5/2017 | Li et al. |
| 2018/0006589 A1 | 1/2018 | Guo et al. |
| 2018/0234041 A1 | 8/2018 | Sun et al. |
| 2019/0115857 A1 | 4/2019 | Sun et al. |

FOREIGN PATENT DOCUMENTS

| | | |
|---|---|---|
| CN | 101907691 | 12/2010 |
| CN | 205982593 | 2/2017 |
| JP | 2001-337147 | 12/2001 |
| JP | 2004180286 | 6/2004 |
| JP | 2008032424 | 2/2008 |
| JP | 2008236737 | 10/2008 |
| JP | 2009002851 | 1/2009 |
| JP | 2010156543 | 7/2010 |
| JP | 2011117811 | 6/2011 |
| JP | 2013074415 | 4/2013 |
| JP | 2017054353 | 3/2017 |

* cited by examiner

FIG.1A

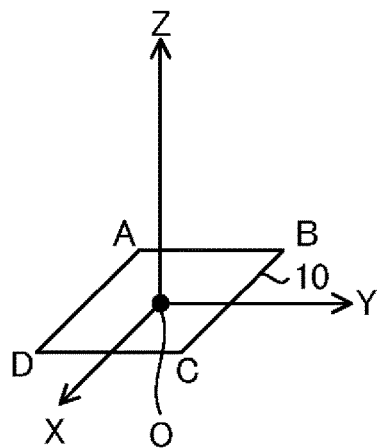

FIG.1B
APPLY S-POLE MAGNETIC FIELD

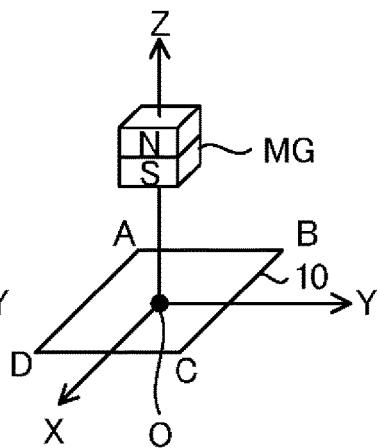

FIG.1C
APPLY N-POLE MAGNETIC FIELD

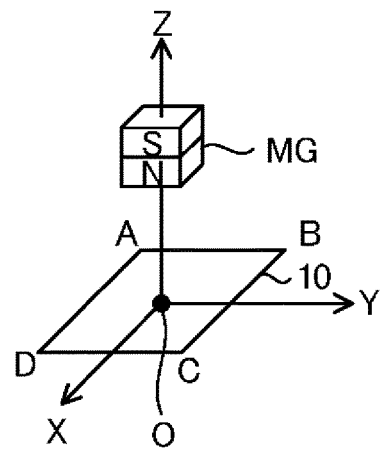

FIG.2

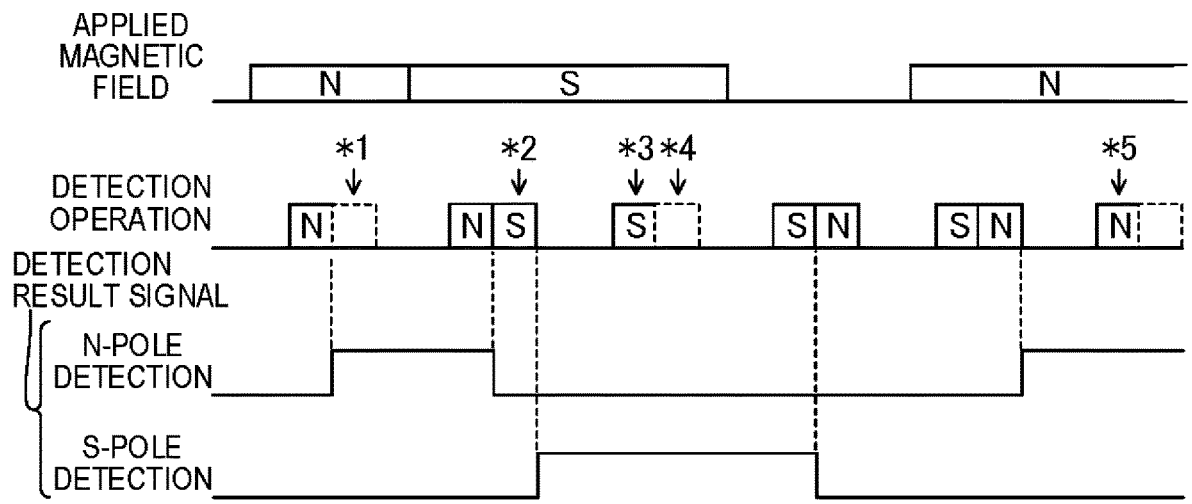

*1: DO NOT PERFORM S-POLE DETECTION OPERATION IF N-POLE IS DETECTED
*2: PERFORM S-POLE DETECTION OPERATION IF N-POLE IS NOT DETECTED
*3: PERFORM S-POLE DETECTION OPERATION FIRST AFTER S-POLE IS DETECTED (S-POLE ADVANCE MODE)
*4: DO NOT PERFORM N-POLE DETECTION OPERATION IF S-POLE IS DETECTED
*5: PERFORM N-POLE DETECTION OPERATION FIRST AFTER N-POLE IS DETECTED (N-POLE ADVANCE MODE)

| STATE TRANSITION TYPE | STATE TRANSITION CONTENT | UNIT OPERATION AFTER STATE TRANSITION ||
| --- | --- | --- | --- |
| | | FIRST DETECTION OPERATION | SECOND DETECTION OPERATION |
| F1 | NON-APPLICATION STATE TO S-POLE APPLICATION STATE (NON-DETECTED STATE TO S-POLE DETECTED STATE) | S-POLE DETECTION OPERATION | NON-EXECUTION |
| F2 | S-POLE APPLICATION STATE TO NON-APPLICATION STATE (S-POLE DETECTED STATE TO NON-DETECTED STATE) | S-POLE DETECTION OPERATION | N-POLE DETECTION OPERATION |
| F3 | NON-APPLICATION STATE TO N-POLE APPLICATION STATE (NON-DETECTED STATE TO N-POLE DETECTED STATE) | S-POLE DETECTION OPERATION | N-POLE DETECTION OPERATION |
| F4 | N-POLE APPLICATION STATE TO NON-APPLICATION STATE (N-POLE DETECTED STATE TO NON-DETECTED STATE) | N-POLE DETECTION OPERATION | S-POLE DETECTION OPERATION |
| F5 | N-POLE APPLICATION STATE TO S-POLE APPLICATION STATE (N-POLE DETECTED STATE TO S-POLE DETECTED STATE) | N-POLE DETECTION OPERATION | S-POLE DETECTION OPERATION |
| F6 | S-POLE APPLICATION STATE TO N-POLE APPLICATION STATE (S-POLE DETECTED STATE TO N-POLE DETECTED STATE) | S-POLE DETECTION OPERATION | N-POLE DETECTION OPERATION |
| F7 | MAINTAIN NON-APPLICATION STATE (MAINTAIN NON-DETECTED STATE) | S-POLE DETECTION OPERATION | N-POLE DETECTION OPERATION |
| F8 | MAINTAIN S-POLE APPLICATION STATE (MAINTAIN S-POLE DETECTED STATE) | S-POLE DETECTION OPERATION | NON-EXECUTION |
| F9 | MAINTAIN N-POLE APPLICATION STATE (MAINTAIN N-POLE DETECTED STATE) | N-POLE DETECTION OPERATION | NON-EXECUTION |

FIG.11

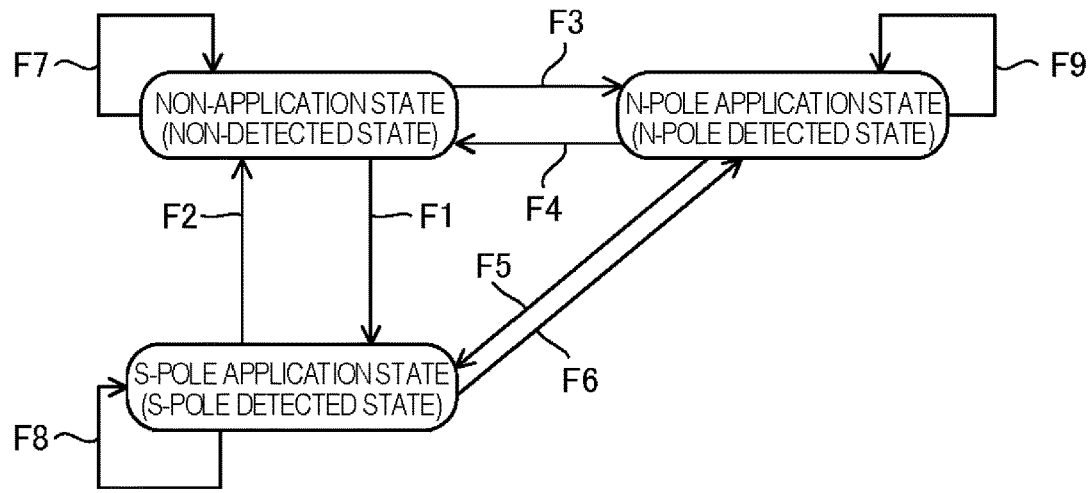

FIG.18A
FIG.18B
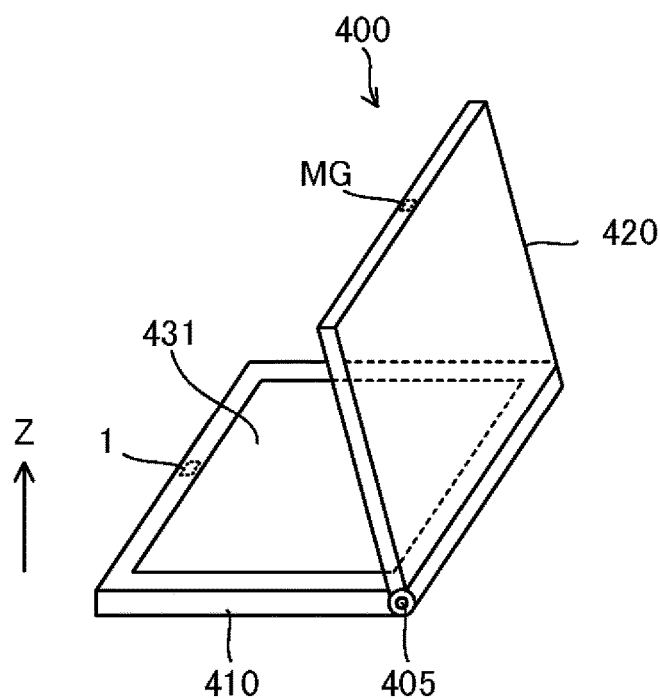
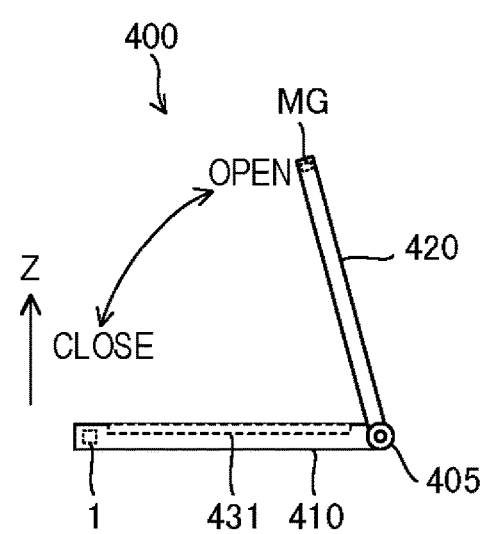
FIG.19A
FIG.19B
CLOSED STATE
OPENED STATE
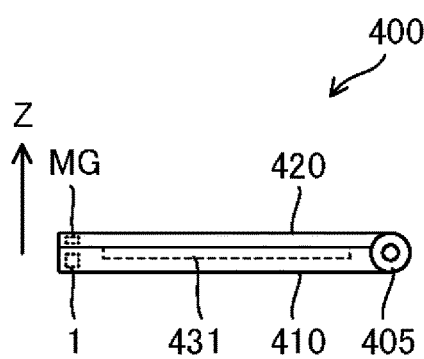
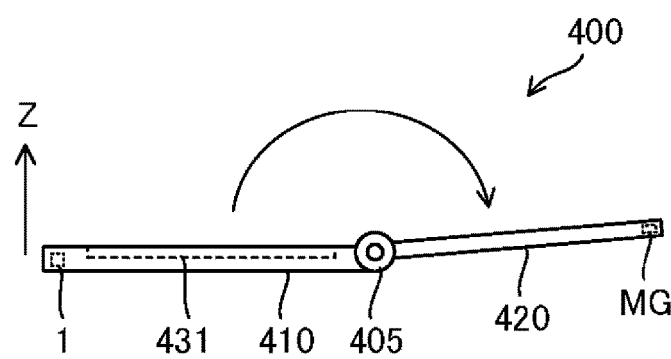

MAGNETIC SENSOR, SEMICONDUCTOR DEVICE, AND ELECTRIC DEVICE

CROSS-REFERENCE TO RELATED APPLICATIONS

This nonprovisional application claims priority under 35 U.S.C. § 119(a) on Patent Application No. 2017-246325 filed in Japan on Dec. 22, 2017, the entire contents of which are hereby incorporated by reference.

BACKGROUND OF THE INVENTION

Field of the Invention

The present invention relates to a magnetic sensor, a semiconductor device constituting the magnetic sensor, and an electric device including the magnetic sensor.

Description of Related Art

Conventionally, various magnetic sensors using a Hall element are proposed (see, for example, Patent Document 1 below). A magnetic sensor is generally constituted of a Hall element that outputs a Hall voltage corresponding to an applied magnetic field, an amplifier that amplifies an output voltage of the Hall element, and a comparator that compares an output voltage of the amplifier with a predetermined reference voltage so as to output a comparison result. The magnetic sensor outputs a binary signal corresponding to whether the magnetic field at a place where the magnetic sensor is disposed is higher or lower than a predetermined reference value.

This type of magnetic sensor is used for detecting opening and closing of a cover of a mobile phone or a tablet computer, for example. In this case, for example, a magnetic sensor is disposed on a main body of the mobile phone or the computer, while a permanent magnet is disposed at the corresponding position of the cover. On the basis of a result of detecting opening or closing of the cover, a control system of the main body can switch between an active state and a sleep state, or can perform other operation. In order to appropriately realize this, the magnetic sensor is required to always monitor whether or not a magnetic field is applied. For reducing power consumption due to continuous monitoring, this type of magnetic sensor usually detects a magnetic field in an intermittent manner.

There are two types of magnetic sensors. One type cannot distinguish a polarity of a magnetic field. The other type can distinguish and detect a polarity of a magnetic field. The latter type is usually used for the above-mentioned magnetic sensor that is used for opening/closing detection, so that opening/closing can be correctly detected regardless of mounting direction of the permanent magnet.

As illustrated in FIG. 23, in the magnetic sensor that can distinguish and detect a polarity of magnetic field, a unit operation including a south pole detection operation for detecting the south pole magnetic field and a north pole detection operation for detecting the north pole magnetic field is periodically performed, and a detection result signal is generated and output based on a result of detection of the south pole detection operation and the north pole detection operation in each unit operation.

Patent Document 1: JP-A-2001-337147

The intermittent drive of the detection operation can reduce power consumption of the magnetic sensor, but there is more room for improvement in power consumption saving of the magnetic sensor.

SUMMARY OF THE INVENTION

Accordingly, it is an object of the present invention to provide a magnetic sensor that can contribute to power consumption saving, a semiconductor device constituting the magnetic sensor, and an electric device including the magnetic sensor.

A first magnetic sensor according to the present invention includes a magnetoelectric conversion element arranged to output a signal corresponding to an applied magnetic field, and a signal processing circuit including a detection circuit and a control circuit. The detection circuit is capable of distinguishing and detecting a magnetic field having a first polarity and a magnetic field having a second polarity opposite to the first polarity by using an output signal of the magnetoelectric conversion element. The control circuit is arranged to control the detection circuit to perform a first detection operation to detect the magnetic field having the first polarity and a second detection operation to detect the magnetic field having the second polarity. The signal processing circuit performs a unit operation repeatedly at an interval. The unit operation includes at least one of the first detection operation and the second detection operation, and controls content of (i+1)th unit operation in accordance with a detection result of the magnetic field in i-th unit operation (i is a natural number).

Specifically, for example, the first magnetic sensor may be arranged as follows: in the case where the magnetic field having the first polarity is detected in the i-th unit operation, the signal processing circuit performs the first detection operation without first performing the second detection operation in the (i+1)th unit operation, and if the magnetic field having the first polarity is detected in the first detection operation in the (i+1)th unit operation, the signal processing circuit does not perform the second detection operation in the (i+1)th unit operation.

More specifically, for example, the first magnetic sensor may be arranged as follows: in the case where the magnetic field having the first polarity is detected in the i-th unit operation, the signal processing circuit performs the first detection operation without first performing the second detection operation in the (i+1)th unit operation, and if the magnetic field having the first polarity is detected in the first detection operation in the (i+1)th unit operation, the signal processing circuit does not perform the second detection operation in the (i+1)th unit operation, and otherwise, the signal processing circuit performs the second detection operation after the first detection operation in the (i+1)th unit operation.

In addition, specifically, for example, the first magnetic sensor may be arranged as follows: in the case where the magnetic field having the second polarity is detected in the i-th unit operation, the signal processing circuit performs the second detection operation without first performing the first detection operation in the (i+1)th unit operation, and if the magnetic field having the second polarity is detected in the second detection operation in the (i+1)th unit operation, the signal processing circuit does not perform the first detection operation in the (i+1)th unit operation.

More specifically, for example, the first magnetic sensor may be arranged as follows: in the case where the magnetic field having the second polarity is detected in the i-th unit operation, the signal processing circuit performs the second detection operation without first performing the first detection operation in the (i+1)th unit operation, and if the magnetic field having the second polarity is detected in the second detection operation in the (i+1)th unit operation, the signal processing circuit does not perform the first detection operation in the (i+1)th unit operation, and otherwise, the signal processing circuit performs the first detection operation after the second detection operation in the (i+1)th unit operation.

In addition, specifically, for example, the first magnetic sensor may be arranged as follows: in the case where neither the magnetic field having the first polarity nor the magnetic field having the second polarity is detected in the i-th unit operation, the signal processing circuit performs one detection operation out of the first detection operation and the second detection operation without first performing the other detection operation in the (i+1)th unit operation, and if a magnetic field having a polarity corresponding to the one detection operation is detected, the signal processing circuit does not perform the other detection operation in the (i+1)th unit operation.

More specifically, for example, the first magnetic sensor may be arranged as follows: in the case where neither the magnetic field having the first polarity nor the magnetic field having the second polarity is detected in the i-th unit operation, the signal processing circuit performs one detection operation out of the first detection operation and the second detection operation without first performing the other detection operation in the (i+1)th unit operation, and if a magnetic field having a polarity corresponding to the one detection operation is detected, the signal processing circuit does not perform the other detection operation in the (i+1)th unit operation, and otherwise, the signal processing circuit performs the other detection operation after the one detection operation in the (i+1)th unit operation.

A second magnetic sensor according to the present invention includes a magnetoelectric conversion element arranged to output a signal corresponding to an applied magnetic field, and a signal processing circuit including a detection circuit and a control circuit, the detection circuit being capable of distinguishing and detecting a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity. The signal processing circuit performs a unit operation repeatedly at an interval, the unit operation including at least one of the first detection operation and the second detection operation, and performs one detection operation out of the first detection operation and the second detection operation without first performing the other detection operation in each unit operation, and if a magnetic field having the corresponding polarity is detected, the signal processing circuit does not perform the other detection operation in the unit operation.

Specifically, for example, the second magnetic sensor may be arranged as follows: in each unit operation, the signal processing circuit performs the one detection operation without first performing the other detection operation, and if the corresponding magnetic field is detected, the signal processing circuit does not perform the other detection operation in the unit operation, and if the corresponding magnetic field is not detected, the signal processing circuit performs the other detection operation after the one detection operation in the unit operation.

A semiconductor device according to the present invention is a semiconductor device constituting the magnetic sensor described in one of the above structures, in which the magnetic sensor is formed using an integrated circuit.

A first electric device according to the present invention includes a semiconductor device constituting the first magnetic sensor, and a post-stage device connected to the semiconductor device. The magnetic sensor is formed using an integrated circuit. The semiconductor device outputs to the post-stage device a detection result signal based on a detection result of a magnetic field in each unit operation. The post-stage device performs a predetermined process based on the detection result signal. The signal processing circuit in the semiconductor device controls content of the (i+1)th unit operation according to the detection result of the magnetic field in the i-th unit operation without depending on control by the post-stage device.

A second electric device according to the present invention includes a semiconductor device constituting the second magnetic sensor, a post-stage device connected to the semiconductor device. The magnetic sensor is formed using an integrated circuit. The semiconductor device outputs to the post-stage device a detection result signal based on a detection result of a magnetic field in each unit operation. The post-stage device performs a predetermined process based on the detection result signal. The signal processing circuit in the semiconductor device performs one detection operation out of the first detection operation and the second detection operation without first performing the other detection operation in each unit operation, and if a magnetic field having the corresponding polarity is detected, the signal processing circuit does not perform the other detection operation without depending on control by the post-stage device in the unit operation.

A third electric device according to the present invention includes a main body portion including the semiconductor device constituting the first or second magnetic sensor, a cover portion attached to the main body portion in an openable and closable manner so as to be in one of a closed state, a first opened state, and a second opened state with respect to the main body portion, and a post-stage device connected to the semiconductor device. The magnetic sensor is formed using an integrated circuit. The semiconductor device outputs to the post-stage device a detection result signal based on a detection result of a magnetic field in each unit operation. The post-stage device performs a predetermined process based on the detection result signal. The main body portion has a first surface and a second surface opposed to each other. The cover portion is disposed at a position facing the first surface of the main body portion in the closed state, the cover portion is disposed at a position facing the second surface of the main body portion in the second opened state, and the cover portion becomes the first opened state in the process in which the cover portion moves between the closed state and the second opened state. A magnet is disposed in the cover portion so that the magnetic sensor detects the magnetic field having the first polarity in the closed state and that the magnetic sensor detects the magnetic field having the second polarity in the second opened state. A distance between the magnetic sensor and the magnet in the first opened state is larger than a distance between the magnetic sensor and the magnet in the closed state as well as a distance between the magnetic sensor and the magnet in the second opened state, so that the magnetic sensor detects neither the magnetic field having the first polarity nor the magnetic field having the second polarity in the first opened state.

For instance, the third electric device may be arranged as follows: the magnetoelectric conversion element of the magnetic sensor outputs a signal corresponding to a magnetic field in a direction connecting the first surface and the second surface, and in the closed state and in the second opened state, a direction connecting the north pole and the south pole of the magnet is perpendicular to the direction connecting the first surface and the second surface, and positions of the magnetic sensor and the magnet are shifted from each other in a direction perpendicular to the direction connecting the first surface and the second surface.

Note that the polarity of magnetic field applied to the magnetoelectric conversion element (a direction of the magnetic flux at a position of the magnetoelectric conversion element) is one of the south pole and the north pole. Therefore, it is understood that the first polarity and the second polarity are the south pole and the north pole, respectively, or are the north pole and the south pole, respectively.

According to the present invention, it is possible to provide a magnetic sensor that can contribute to power consumption saving, a semiconductor device constituting the magnetic sensor, and an electric device including the magnetic sensor.

BRIEF DESCRIPTION OF THE DRAWINGS

FIGS. 1A to 1C are diagrams showing relationships between a polarity of magnetic field and an X axis, a Y axis and a Z axis that are referred to in an embodiment of the present invention.

FIG. 2 is an explanatory diagram of a basic operation concept of a magnetic sensor according to the embodiment of the present invention.

FIG. 9 is an explanatory diagram of operational control associated with state transition of a magnetic field according to the embodiment of the present invention.

FIG. 10 is an explanatory diagram of operational control associated with state transition of the magnetic field according to the embodiment of the present invention.

FIG. 11 is a state transition diagram according to the embodiment of the present invention.

FIGS. 18A and 18B are external perspective view and an external side view of a personal computer (PC) according to a fourth example of the present invention.

FIGS. 19A and 19B are side views of the PC when the cover is in a closed state, and in an opened state, respectively, according to the fourth example of the present invention.

DETAILED DESCRIPTION OF THE PREFERRED EMBODIMENTS

Figure 3:
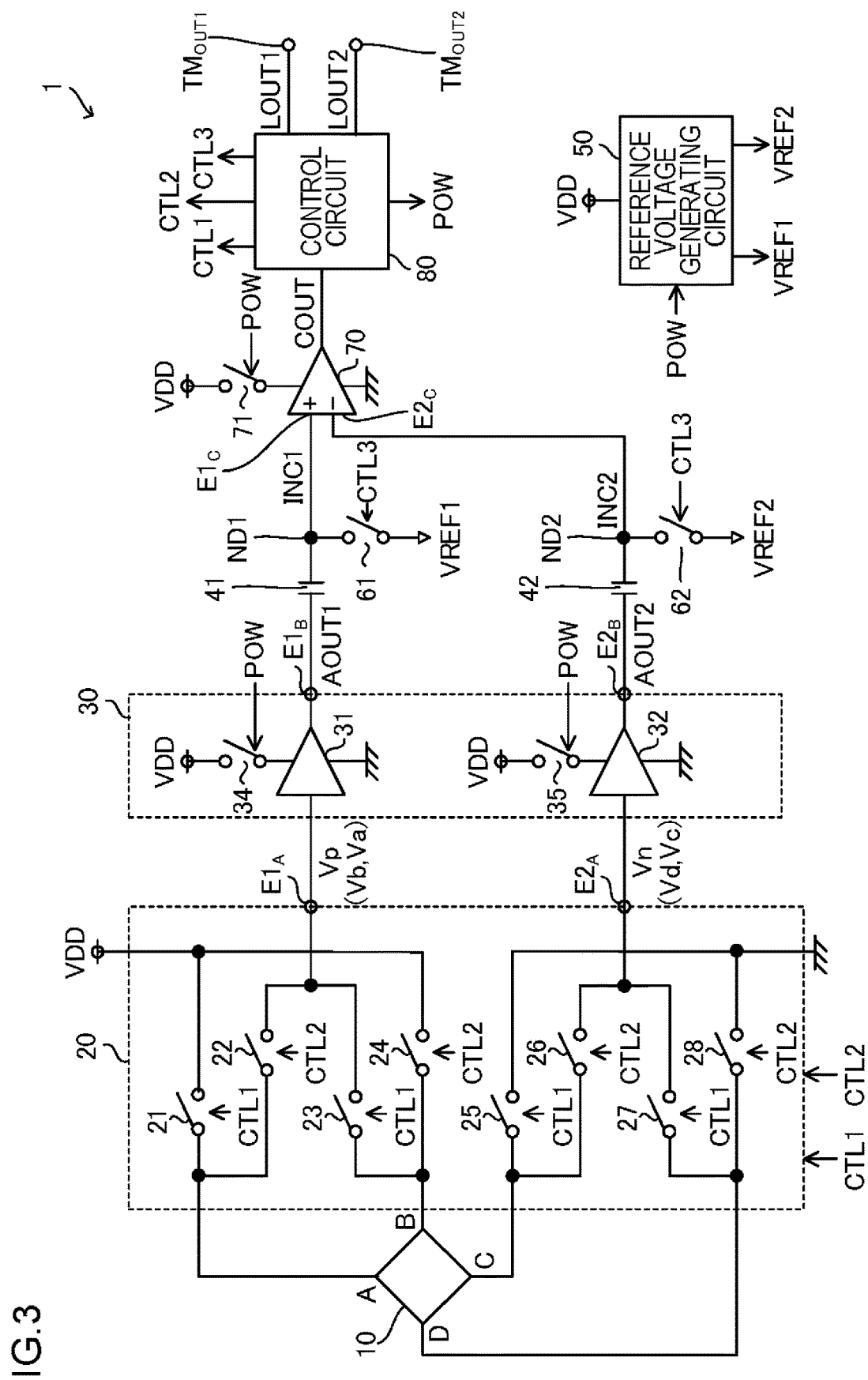
FIG. 3 is a circuit structural diagram of the magnetic sensor according to the embodiment of the present invention.

Examples of an embodiment of the present invention are described in detail below with reference to the drawings. In the drawings to be referred, the same part is denoted by the same numeral or symbol so that overlapping description of the same part is omitted as a rule. Note that in this specification, for simple description, a name of information, a signal, physical quantity, a member, or the like may be omitted or abbreviated by using its symbol or numeral.

FIG. 1A is referred. In this embodiment, for specific and clear description, an X axis, a Y axis and a Z axis are defined, which orthogonally cross each other at the origin O. A Hall element 10 included in a magnetic sensor according to this embodiment is disposed in a plane perpendicular to the Z axis and has four terminals A, B, C, and D. The center of the Hall element 10 (the center of the rectangle formed by connecting the terminals A to D) is positioned at the origin O. The Hall element 10 is formed like a plate having a geometrically equivalent shape concerning the four terminals A, B, C, and D. The geometrically equivalent shape means that a shape of the Hall element 10 at an arbitrary initial state and its shape after the Hall element 10 is rotated from the initial state by 90 degrees about the Z axis are identical to each other, when viewing the Hall element 10 along the Z axis from an arbitrary position on the Z axis (except the origin O).

With reference to FIGS. 1B and 1C, a magnet MG is supposed on the Z axis, which has a north pole and a south pole disposed adjacent to each other along the Z axis. The magnet MG is a permanent magnet but may be an electromagnet. In this embodiment, as shown in FIG. 1B, in the case where the magnet MG is disposed on the positive side of the Z axis, and the south pole is closer to the Hall element 10 than the north pole is, and thereby magnetic force lines are generated from the negative side to the positive side of the Z axis via the origin O, it is considered that the south pole magnetic field is applied to the Hall element 10. In contrast, as shown in FIG. 1C, in the case where the magnet MG is disposed on the positive side of the Z axis, and the north pole is closer to Hall element 10 than the south pole is, and thereby magnetic force lines are generated from the positive side to the negative side of the Z axis via the origin O, it is considered that the north pole magnetic field is applied to the Hall element 10. In this embodiment, when simply mentioning the magnetic field, it means the magnetic field that is applied to the Hall element 10. The magnetic field applied to the Hall element 10 is the magnetic field applied to the magnetic sensor including the Hall element 10.

With reference to FIG. 2, a basic operation concept of the magnetic sensor according to the embodiment of the present invention is described. The magnetic sensor according to this embodiment performs a unit operation including at least one of a south pole detection operation and a north pole detection operation repeatedly at an interval. In this case, the unit operation is performed repeatedly at a constant period. However, it may be possible that an interval between $i_A$-th unit operation execution timing and $(i_A+1)$th unit operation execution timing is different from an interval between $i_B$-th unit operation execution timing and $(i_B+1)$th unit operation execution timing ($i_A$ and $i_B$ are different natural numbers).

The south pole detection operation is an operation of determining and detecting whether or not the south pole magnetic field having a predetermined reference intensity or more is applied to the Hall element 10 based on an output signal of the Hall element 10. If the south pole magnetic field of a predetermined reference intensity or more is applied to the Hall element 10, it means that there is a magnetic field having a predetermined intensity or more and a direction of the magnetic flux from the origin O to the positive side of the Z axis at a position of the Hall element 10. In the south pole detection operation, to detect that the south pole magnetic field having a predetermined reference intensity or more is applied to the Hall element 10 is referred to as presence of detection of the south pole or simply as detection of the south pole, and not to detect that the south pole magnetic field having a predetermined reference intensity or more is applied to the Hall element 10 is referred to as absence of detection of the south pole or simply as non-detection of the south pole.

The north pole detection operation is an operation of determining and detecting whether or not the north pole magnetic field having a predetermined reference intensity or more is applied to the Hall element 10 based on an output signal of the Hall element 10. If the north pole magnetic field having a predetermined reference intensity or more is applied to the Hall element 10, it means that there is a magnetic field having a predetermined intensity or more and a direction of the magnetic flux from the positive side of the Z axis to the origin O at a position of the Hall element 10. In the north pole detection operation, to detect that the north pole magnetic field having a predetermined reference intensity or more is applied to the Hall element 10 is referred to as presence of detection of the north pole or simply as detection of the north pole, and not to detect that the north pole magnetic field having a predetermined reference inten-sity or more is applied to the Hall element 10 is referred to as absence of detection of the north pole or simply as non-detection of the north pole.

The predetermined reference intensity in the south pole detection operation may be the same as or different from the predetermined reference intensity in the north pole detection operation.

Each unit operation is performed in an operation mode that is one of a south pole advance mode and a north pole advance mode.

In the unit operation of the south pole advance mode, it is scheduled to perform the south pole detection operation and then to perform the north pole detection operation. However, if the south pole is detected (i.e. if presence of detection of the south pole is determined) in the south pole detection operation that is performed first, the north pole detection operation is not performed in the unit operation, and the unit operation is finished. In this way, power consumption is reduced because of the north pole detection operation that does not need to be performed. In the unit operation of the south pole advance mode, if the south pole is not detected (i.e. if absence of detection of the south pole is determined) in the south pole detection operation that is performed first, the north pole detection operation is performed after the south pole detection operation in the unit operation.

In the unit operation of the north pole advance mode, it is scheduled to perform the north pole detection operation and then to perform the south pole detection operation. However, if the north pole is detected (i.e. if presence of detection of the north pole is determined) in the north pole detection operation that is performed first, the south pole detection operation is not performed in the unit operation, and the unit operation is finished. In this way, power consumption is reduced because of the south pole detection operation that does not need to be performed. In the unit operation of the north pole advance mode, if the north pole is not detected (i.e. if absence of detection of the north pole is determined) in the north pole detection operation that is performed first, the south pole detection operation is performed after the north pole detection operation in the unit operation.

If the south pole is detected in the i-th unit operation, the (i+1)th unit operation is performed in the south pole advance mode (i is a natural number). If the south pole is detected in the i-th unit operation, it is very likely that the south pole is detected also when performing the (i+1)th unit operation. Therefore, by performing the south pole detection operation first in the (i+1)th unit operation, it becomes more probable that the north pole detection operation does not need to be performed (consequently, power consumption is reduced).

In the same manner, if the north pole is detected in the i-th unit operation, the (i+1)th unit operation is performed in the north pole advance mode. If the north pole is detected in the i-th unit operation, it is very likely that the north pole is detected also when performing the (i+1)th unit operation. Therefore, by performing the north pole detection operation first in the (i+1)th unit operation, it becomes more probable that the south pole detection operation does not need to be performed (consequently, power consumption is reduced).

Note that if neither the south pole nor the north pole is detected in the i-th unit operation, the operation mode in the i-th unit operation is applied to the (i+1)th unit operation too, or a predetermined one of the south pole advance mode and the north pole advance mode is applied to the (i+1)th unit operation.

FIG. 3 illustrates a circuit structure of a magnetic sensor 1 of this embodiment that realizes the operation described above. The magnetic sensor 1 includes the components illustrated in FIG. 3, including individual portions denoted by numerals 10, 20, 30, 41, 42, 50, 61, 62, 70, 71 and 80. The magnetic sensor 1 is supplied with a power supply voltage VDD, which is a positive DC voltage generated by a power supply circuit (not shown). Unless otherwise noted, any voltage mentioned in this embodiment is a potential with respect to a ground having a reference potential of 0 V (volts).

The Hall element 10 outputs a signal indicating Hall voltage corresponding to magnetic field intensity and a polarity of magnetic field applied to itself (i.e. magnetic field intensity and a direction of the magnetic flux at a position of the Hall element 10) from a first terminal pair including terminals A and C or a second terminal pair including terminals B and D.

The switch circuit 20 is a circuit that supplies the power supply voltage VDD to one of the first terminal pair and the second terminal pair in accordance with switch signals CTL1 and CTL2, and obtains the Hall voltage from the other terminal pair. Specifically, the switch circuit 20 includes switches 21, 23, 25 and 27 that are on-off controlled in accordance with a level (logic) of the switch signal CTL1, and switches 22, 24, 26 and 28 that are on-off controlled in accordance with a level (logic) of the switch signal CTL2, and has output terminals $E1_A$ and $E2_A$. Each of the switches described in this embodiment, including the switches 21 to 28, is constituted of a semiconductor switching element such as a metal-oxide-semiconductor field-effect transistor (MOSFET).

Each of binary signals including the switch signals CTL1 and CTL2 as well as a switch signal CTL3 and a power supply on signal POW that are described later has one of signal potentials, which are a low level and a high level that has a higher potential than the low level. It is supposed here that the switches 21, 23, 25 and 27 are turned off when the switch signal CTL1 is at the low level and are turned on when the switch signal CTL1 is at the high level, and that the switches 22, 24, 26 and 28 are turned off when the switch signal CTL2 is at the low level, and are turned on when the switch signal CTL2 is at the high level. Note that the above-mentioned relationship between a signal level and on/off is merely an example, and it may be possible to adopt the relationship in the opposite manner.

During a sensing period in which the power supply on signal POW is at the high level, the switch circuit 20 is in a first switched state in which the switch signal CTL1 is at the high level and the switch signal CTL2 is at the low level, or is in a second switched state in which the switch signal CTL1 is at the low level and the switch signal CTL2 is at the high level. Although detailed timing is described later, the power supply on signal POW is a signal that is intermittently turned on, and magnetic detection (i.e. magnetic field detection) by the magnetic sensor 1 is performed only in the period in which the power supply on signal POW is at the high level.

In the first switched state, the power supply voltage VDD is applied to the terminal A via the switch 21, and the terminal C is connected to the ground via the switch 25. Further, the terminal B is connected to the output terminal $E1_A$ via the switch 23, and the terminal D is connected to the output terminal $E2_A$ via the switch 27. Therefore, in the first switched state, a Hall voltage corresponding to the magnetic field intensity and polarity is generated between the terminals B and D, a voltage Vb at the terminal B is applied to the output terminal $E1_A$ as a voltage Vp, and a voltage Vd at the terminal D is applied to the output terminal $E2_A$ as a voltage Vn.

In the second switched state, the power supply voltage VDD is applied to the terminal B via the switch 24, and the terminal D is connected to the ground via the switch 28. Further, the terminal A is connected to the output terminal $E1_A$ via the switch 22, and the terminal C is connected to the output terminal $E2_A$ via the switch 26. Therefore, in the second switched state, a Hall voltage corresponding to the magnetic field intensity and polarity is generated between the terminals A and C, a voltage Va at the terminal A is applied to the output terminal $E1_A$ as the voltage Vp, and a voltage Vc at the terminal C is applied to the output terminal $E2_A$ as the voltage Vn.

The voltages at the terminals B and D in the first switched state, as well as the voltages at the terminals A and C in the second switched state are varied depending on the intensity and polarity of the applied magnetic field. It is supposed here that the Hall element 10 is formed in the following conditions:

in the first switched state, when the south pole magnetic field is applied to the Hall element 10, the voltage Vd at the terminal D is higher than the voltage Vb at the terminal B, and when the north pole magnetic field is applied to the Hall element 10, the voltage Vd at the terminal D is lower than the voltage Vb at the terminal B; and in the second switched state, when the south pole magnetic field is applied to the Hall element 10, the voltage Va at the terminal A is higher than the voltage Vc at the terminal C, and when the north pole magnetic field is applied to the Hall element 10, the voltage Va at the terminal A is lower than the voltage Vc at the terminal C.

The amplifying circuit portion 30 includes an amplifying circuit 31 connected to the output terminal $E1_A$ and an amplifying circuit 32 connected to the output terminal $E2_A$, and includes switches 34 and 35 that are on-off controlled in accordance with the power supply on signal POW. The amplifying circuit 31 amplifies the voltage Vp (Vb or Va) at the output terminal $E1_A$ by a predetermined amplification degree α and outputs an amplified voltage AOUT1 obtained as above, from an amplification output terminal $E1_B$. The amplifying circuit 32 amplifies the voltage Vn (Vd or Vc) at the output terminal $E2_A$ by the predetermined amplification degree α and outputs an amplified voltage AOUT2 obtained as above, from an amplification output terminal $E2_B$.

The amplifying circuits 31 and 32 are applied with the power supply voltage VDD as a drive voltage via the switches 34 and 35, respectively. It is supposed here that when the power supply on signal POW is at the high level, the switches 34 and 35 are turned on so as to supply the power supply voltage VDD to the amplifying circuits 31 and 32, and that when the power supply on signal POW is at the low level, the switches 34 and 35 are turned off so as to stop supplying the power supply voltage VDD to the amplifying circuits 31 and 32. Note that the above-mentioned relationship between a signal level and on/off is merely an example, and it may be possible to adopt the relationship in the opposite manner.

The capacitor 41 is connected between the first amplification output terminal $E1_B$ of the amplifying circuit portion 30 and a first comparison input terminal $E1_C$ of the comparison circuit 70. The capacitor 42 is connected between a second amplification output terminal $E2_B$ of the amplifying circuit portion 30 and a second comparison input terminal $E2_C$ of the comparison circuit 70. It is supposed here that the first comparison input terminal $E1_C$ and the second comparison input terminal $E2_C$ of the comparison circuit 70 are a non-inverting input terminal (+) and an inverting input terminal (−) of the comparison circuit 70, respectively, but the relationship thereof may be inverted as a variation.

When the power supply on signal POW is at the high level, the reference voltage generating circuit 50 generates reference voltages VREF1 and VREF2 as positive DC voltages on the basis of the power supply voltage VDD. However, the reference voltage VREF2 is higher than the reference voltage VREF1 by a predetermined voltage VREF (VREF>0).

The wiring that connects the comparison input terminal $E1_C$ of the comparison circuit 70 and the capacitor 41 is connected to the switch 61 at a node ND1 and is connected to the reference voltage generating circuit 50 via the switch 61. The reference voltage VREF1 is applied to the node ND1 and the comparison input terminal $E1_C$ of the comparison circuit 70 only when the switch 61 is turned on. The wiring that connects the comparison input terminal $E2_C$ of the comparison circuit 70 and the capacitor 42 is connected to the switch 62 at a node ND2 and is connected to the reference voltage generating circuit 50 via the switch 62. The reference voltage VREF2 is applied to the node ND2 and the comparison input terminal $E2_C$ of the comparison circuit 70 only when the switch 62 is turned on. The switches 61 and 62 are on-off controlled in accordance with a level (logic) of the switch signal CTL3. It is supposed here that the switches 61 and 62 are turned off when the switch signal CTL3 is at the low level and are turned on when the switch signal CTL3 is at the high level. Note that the above-mentioned relationship between a signal level and on/off is merely an example, and it may be possible to adopt the relationship in the opposite manner.

The comparison circuit 70 compares a first comparison voltage INC1 applied to the first comparison input terminal $E1_C$ and the node ND1 with a second comparison voltage INC2 applied to the second comparison input terminal $E2_C$ and the node ND2, and outputs a comparison result signal COUT at the high level if the comparison voltage INC1 is higher than the comparison voltage INC2, while it outputs the comparison result signal COUT at the low level if the comparison voltage INC1 is lower than the comparison voltage INC2. If "INC1=INC2" holds, a level of the comparison result signal COUT is one of the high level and the low level, and it is supposed here to be the low level.

In addition, the comparison circuit 70 is applied with the power supply voltage VDD as the drive voltage via the switch 71. It is supposed here that when the power supply on signal POW is at the high level, the switch 71 is turned on so as to supply the power supply voltage VDD to the comparison circuit 70, and that when the power supply on signal POW is at the low level, the switch 71 is turned off so as to stop supplying the power supply voltage VDD to the comparison circuit 70. Note that the above-mentioned relationship between a signal level and on/off is merely an example, and it may be possible to adopt the relationship in the opposite manner.

The control circuit 80 includes a oscillator circuit that generates a clock signal having a predetermined frequency, and a logical circuit that generates the switch signals CTL1 to CTL3 and the power supply on signal POW using the clock signal and generates and outputs output signals LOUT1 and LOUT2 based on the comparison result signal COUT from the comparison circuit 70. Although details are described later, the output signal LOUT1 indicates a detection result of the south pole detection operation, and the output signal LOUT2 indicates a detection result of the north pole detection operation. The output signals LOUT1 and LOUT2 can be output to outside of the magnetic sensor 1 from external output terminals $TM_{OUT1}$ and $TM_{OUT2}$ of the magnetic sensor 1, respectively.

Figure 4:
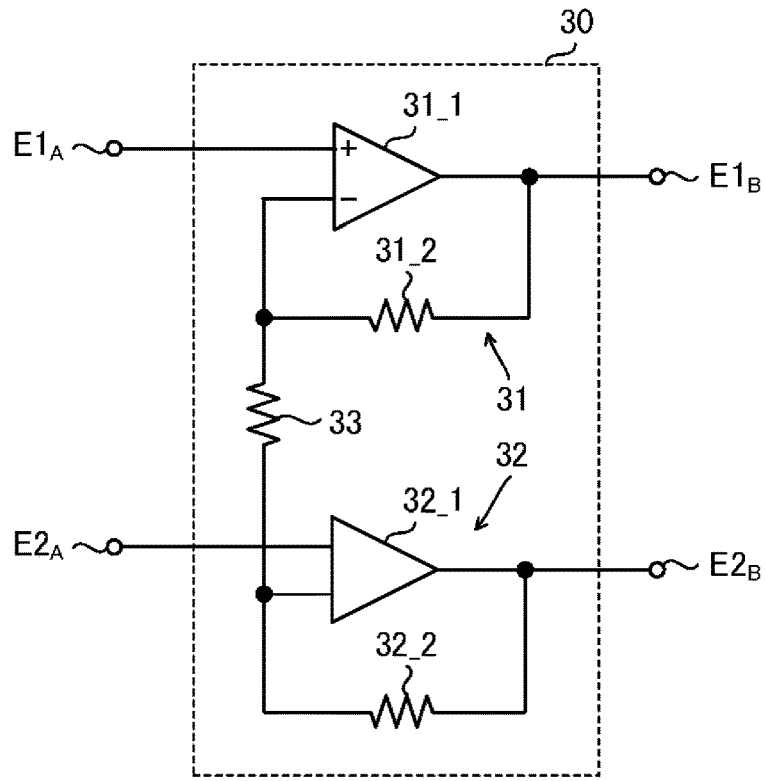
FIG. 4 is a diagram illustrating an internal circuit example of an amplifying circuit portion illustrated in FIG. 3.

FIG. 4 illustrates a specific circuit example of the amplifying circuit portion 30. The amplifying circuit portion 30 of FIG. 4 includes amplifiers 31_1 and 32_1, and feedback resistors 31_2, 32_2 and 33. Although not shown in FIG. 4, the amplifiers 31_1 and 32_1 are supplied with the power supply voltage VDD via the switches 34 and 35 so as to operate, respectively. The output terminals $E1_A$ and $E2_A$ of the switch circuit 20 are connected to the non-inverting input terminals of the amplifier 31_1 and the amplifier 32_1, respectively. The output terminal of the amplifier 31_1 that functions as the amplification output terminal $E1_B$ is connected to the inverting input terminal of the amplifier 31_1 via the feedback resistor 31_2, and the output terminal of the amplifier 32_1 that functions as the amplification output terminal $E2_B$ is connected to the inverting input terminal of the amplifier 32_1 via the feedback resistor 32_2. In addition, the inverting input terminals of the amplifiers 31_1 and 32_1 are connected to each other via the feedback resistor 33. The amplifying circuit 31 of FIG. 3 is constituted of the amplifier 31_1 and the feedback resistors 31_2 and 33, and the amplifying circuit 32 of FIG. 3 is constituted of the amplifier 32_1 and the feedback resistors 32_2 and 33. In the circuit of FIG. 4, the amplifying circuits 31 and 32 share the feedback resistor 33, but the amplifying circuits may be formed without sharing.

Figure 5:
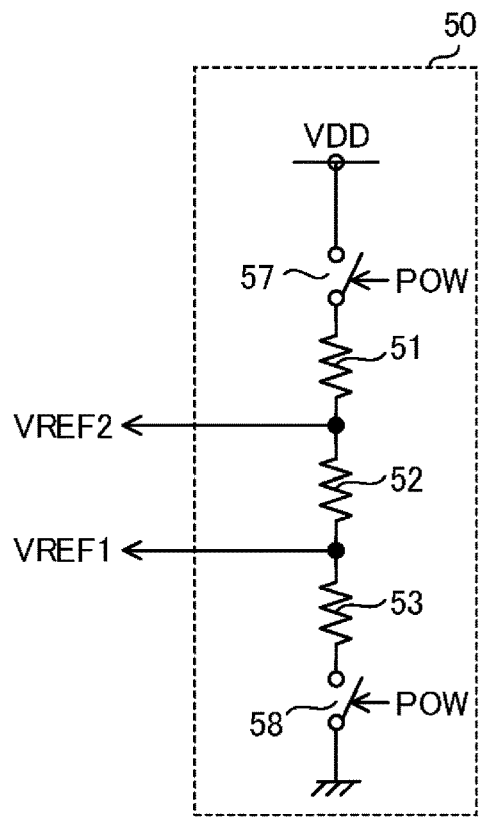
FIG. 5 is a diagram illustrating an internal circuit example of a reference voltage generating circuit illustrated in FIG. 3.

FIG. 5 illustrates a specific circuit example of the reference voltage generating circuit 50. The reference voltage generating circuit 50 of FIG. 5 includes voltage dividing resistors 51 to 53 and switches 57 and 58 connected in series between the ground and the terminal applied with the power supply voltage VDD. The switch 57, the voltage dividing resistors 51, 52, 53, and the switch 58 are disposed in order from the terminal applied with the power supply voltage VDD to the ground. The power supply voltage VDD is applied to the series circuit of the voltage dividing resistors 51 to 53 only when both the switches 57 and 58 are turned on, which are on-off controlled in accordance with the power supply on signal POW. It is supposed here that only when the power supply on signal POW is at the high level, the switches 57 and 58 are turned on so that the reference voltage VREF2 is generated at the connection node between the voltage dividing resistors 51 and 52, and the reference voltage VREF1 is generated at the connection node between the voltage dividing resistors 52 and 53. Note that the above-mentioned relationship between a signal level and on/off is merely an example, and it may be possible to adopt the relationship in the opposite manner.

[South Pole Detection Operation]

Figure 6:
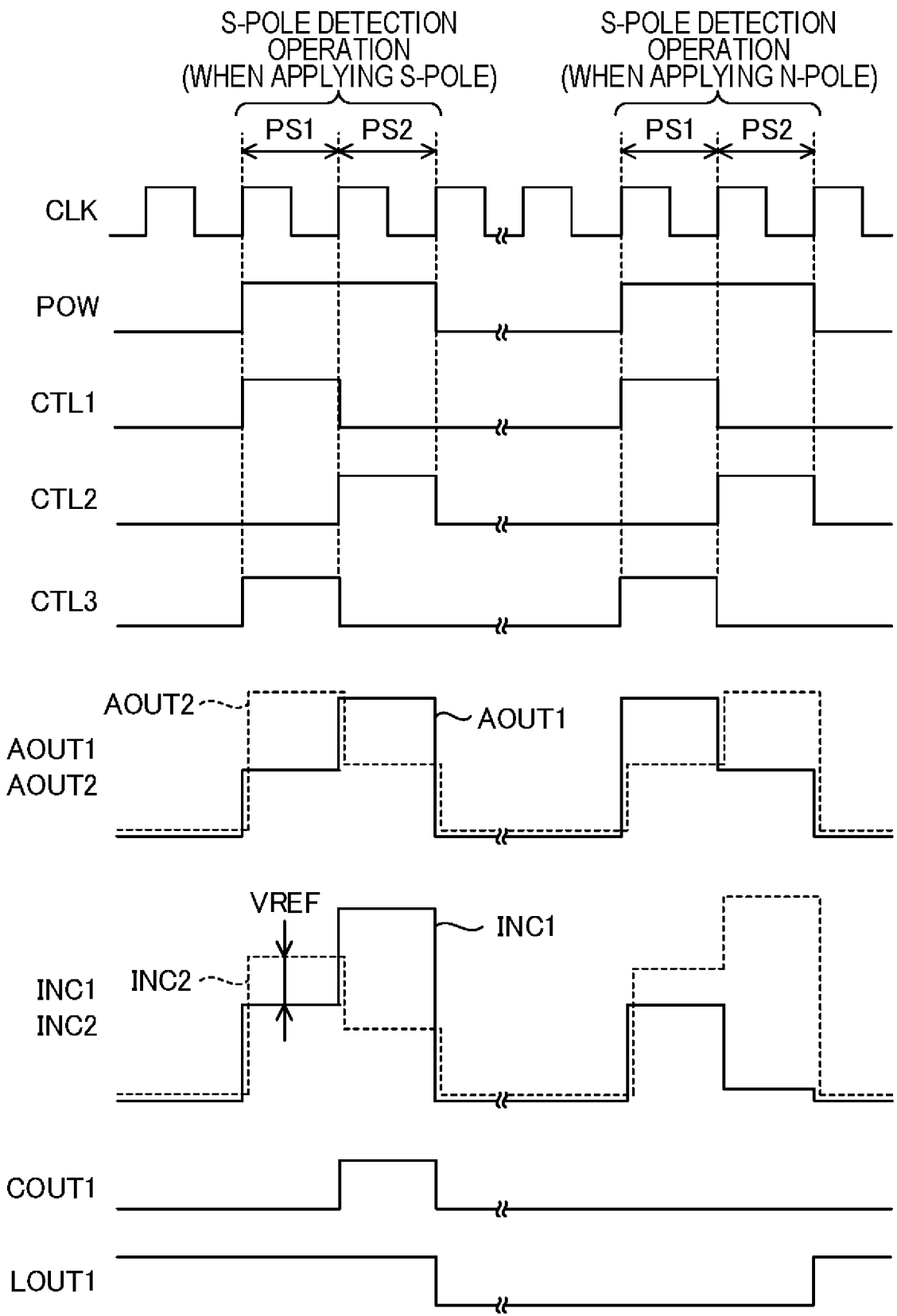
FIG. 6 is a diagram showing signal waveforms at individual portions in the magnetic sensor related to a south pole detection operation according to the embodiment of the present invention.

With reference to FIG. 6, the south pole detection operation of the magnetic sensor 1 is described. Note that in FIG. 6, signal waveforms of the amplified voltage AOUT1 and the comparison voltage INC1 are shown in solid lines, while signal waveforms of the amplified voltage AOUT2 and the comparison voltage INC2 are shown in broken lines. Further, for convenience sake of illustration, the solid line of the signal waveform of the amplified voltage AOUT1 and the broken line of the signal waveform of the amplified voltage AOUT2 are shifted from each other, and the solid line of the signal waveform of the comparison voltage INC1 and the broken line of the signal waveform of the comparison voltage INC2 are shifted from each other (the same is true in FIG. 7 described later). In addition, the magnetic sensor 1 has a signal delay corresponding to the circuit structure, but the signal delay is neglected in FIG. 6 (the same is true in FIG. 7 described later).

The control circuit 80 generates a reference clock signal CLK that is a rectangular wave signal having a predetermined reference frequency based on the clock signal generated by the oscillator circuit. The south pole detection operation is performed using a two-clock period of the reference clock signal CLK. A first half clock interval (in other words, a first half clock period) and a second half clock interval (in other words, a second half clock period) of the two-clock period for the south pole detection operation are denoted by PS1 and PS2, respectively. In the first half clock interval PS1, the switch signals CTL1 and CTL3 are at the high level, and the switch signal CTL2 is at the low level. In the second half clock interval PS2, the switch signals CTL1 and CTL3 are at the low level, and the switch signal CTL2 is at the high level. The power supply on signal POW is at the high level during execution of the south pole detection operation (i.e. during the intervals PS1 and PS2). Note that the switch signals CTL1 to CTL3 and the power supply on signal POW are maintained at the low level during intervals in which neither the south pole detection operation nor the north pole detection operation is performed.

In synchronization with a rising edge of the reference clock signal CLK at start of the first half clock interval PS1 in the south pole detection operation, levels of the switch signals CLT1 and CTL3 are changed from the low level to the high level.

When the switch signal CLT1 becomes the high level, the switch circuit 20 becomes the first switched state. When the switch circuit 20 becomes the first switched state, the voltages Vb and Vd at the terminals B and D of the Hall element 10 are applied to the output terminals $E1_A$ and $E2_A$ of the switch circuit 20, and hence the amplified voltages AOUT1 and AOUT2 are as follows:

$$AOUT1 = \alpha(Vb - Voffa1),\text{ and}$$

$$AOUT2 = \alpha(Vd - Voffa2),$$

where Voffa1 and Voffa2 represent input offset voltages of the amplifying circuits 31 and 32, respectively.

In contrast, in the first half clock interval PS1 in the south pole detection operation, as the switch signal CLT3 becomes the high level, the switch signal switches 61 and 62 are turned on. Therefore, the input terminals $E1_C$ and $E2_C$ of the comparison circuit 70 are supplied with the reference voltages VREF1 and VREF2 as the comparison voltages INC1 and INC2, respectively.

In this way, the capacitor 41 is charged by the difference voltage "VREF1−α(Vb−Voffa1)" between the reference voltage VREF1 and the amplified voltage AOUT1, and the capacitor 42 is charged by the difference voltage "VREF2−α(Vd−Voffa2)" between the reference voltage VREF2 and the amplified voltage AOUT2.

After performing the charging described above, in synchronization with the next rising edge of the reference clock signal CLK, levels of the switch signals CLT1 and CTL3 are changed from the high level to the low level, and a level of the switch signal CTL2 is changed from the low level to the high level.

When the switch signal CLT2 becomes the high level, the switch circuit 20 becomes the second switched state. When the switch circuit 20 becomes the second switched state, the voltages Va and Vc at the terminals A and C of the Hall element 10 are applied to the output terminals $E1_A$ and $E2_A$ of the switch circuit 20, and hence the amplified voltages AOUT1 and AOUT2 are expressed as "AOUT1=α(Va−Voffa1)" and "AOUT2=α(Vc−Voffa2)".

In contrast, in the second half clock interval PS2 in the south pole detection operation, as the switch signal CLT3 becomes the low level, the switches 61 and 62 are turned off. As charges of the capacitors 41 and 42 are maintained, the comparison voltages INC1 and INC2 in the second half clock interval PS2 are expressed by the following equations (1) and (2), respectively. These comparison voltages INC1 and INC2 do not contain the input offset voltages Voffa1 and Voffa2 of the amplifying circuits 31 and 32, which are cancelled by each other.

$$INC1 = VREF1 - \alpha(Vb - Voffa1) + \alpha(Va - Voffa1) \qquad (1)$$
$$= VREF1 - \alpha(Vb - Va)$$

$$INC2 = VREF2 - \alpha(Vd - Voffa2) + \alpha(Vc - Voffa2) \qquad (2)$$
$$= VREF2 - \alpha(Vd - Vc)$$

The left side half of FIG. 6 shows signal waveforms when the south pole magnetic field having a predetermined reference intensity or more is applied to the Hall element 10. In this case, "INC1>INC2" holds in the second half clock interval PS2 in the south pole detection operation, and the comparison result signal COUT at the high level is output. When the south pole magnetic field having a predetermined reference intensity or more is not applied to the Hall element 10, "INC1>INC2" does not hold in the second half clock interval PS2 in the south pole detection operation, and the comparison result signal COUT at the low level is output. As an example, the right side half of FIG. 6 shows signal waveforms when the north pole magnetic field is applied to the Hall element 10.

The output voltage of the Hall element 10 includes an offset signal component (referred to as an element offset voltage) generated by a stress that the Hall element 10 receives from the package and the like. In a voltage generated between the terminals B and D in the first switched state, and in a voltage generated between the terminals A and C in the second switched state, effective signal component voltages corresponding to the magnetic fields have the same phase, while element offset voltages have opposite phases. In other words, when the element offset voltages contained in the voltages Vb, Vd, Va and Vc are denoted by Vboffe, Vdoffe, Vaoffe and Vcoffe, respectively, the relationship equation "Vboffe−Vdoffe=Vaoffe−Vcoffe" is satisfied. This relationship equation shows that the element offset voltage is cancelled in the difference voltage between the comparison voltages INC1 and INC2 (i.e. in the stage of comparing the comparison voltages INC1 and INC2).

The control circuit 80 sets the output signal LOUT1 to the high level as a rule, determines that the south pole is detected in the south pole detection operation if the comparison result signal COUT in the second half clock interval PS2 in the south pole detection operation is at the high level, and sets the output signal LOUT1 to the low level. After the output signal LOUT1 is set to the low level, the low level of the output signal LOUT1 is maintained until the following first or second condition is satisfied. When at least one of the first and second conditions is satisfied, the output signal LOUT1 is restored to the high level. The first condition is that the south pole is not detected in the south pole detection operation that will be performed. The second condition is that the north pole is detected in the north pole detection operation that will be executed.

[North Pole Detection Operation]

Figure 7:
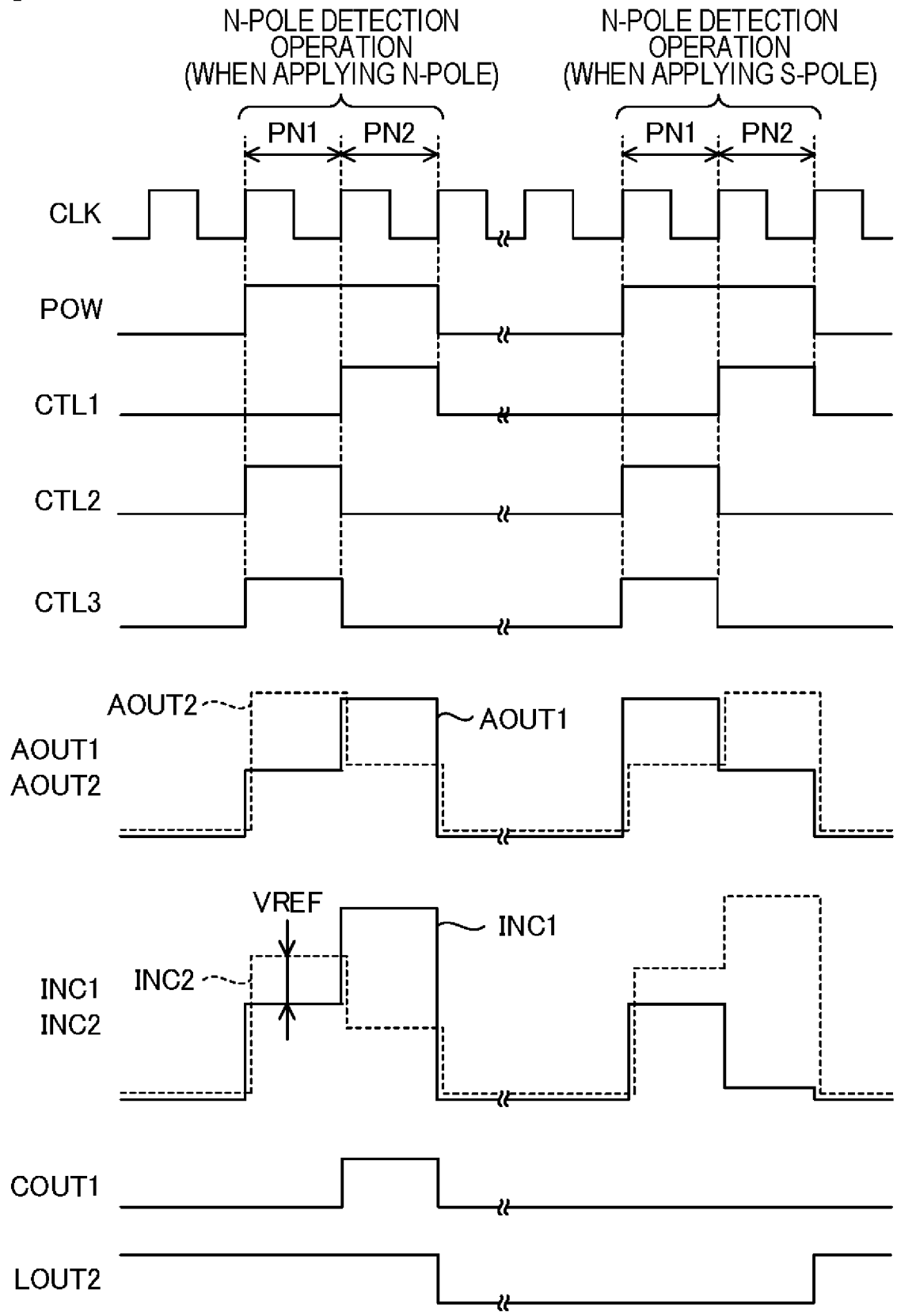
FIG. 7 is a diagram showing signal waveforms at individual portions in the magnetic sensor related to a north pole detection operation according to the embodiment of the present invention.

With reference to FIG. 7, the north pole detection operation by the magnetic sensor 1 is described.

The north pole detection operation is performed using a two-clock period of the reference clock signal CLK. A first half clock interval (in other words, a first half clock period) and a second half clock interval (in other words, a second half clock period) of the two-clock period for the north pole detection operation are denoted by PN1 and PN2, respectively. In the north pole detection operation, unlike the south pole detection operation, the switch signals CTL2 and CTL3 are at the high level, and the switch signal CTL1 is at the low level in the first half clock interval PN1. In the second half clock interval PN2, the switch signals CTL2 and CTL3 are at the low level, and the switch signal CTL1 is at the high level. The power supply on signal POW is at the high level during execution of the north pole detection operation (i.e. during the intervals PN1 and PN2).

In synchronization with a rising edge of the reference clock signal CLK at start of the first half clock interval PN1 in the north pole detection operation, levels of the switch signals CLT2 and CTL3 are changed from the low level to the high level.

When the switch signal CLT2 becomes the high level, the switch circuit 20 becomes the second switched state. When the switch circuit 20 becomes the second switched state, the voltages Va and Vc at the terminals A and C of the Hall element 10 are applied to the output terminals $E1_A$ and $E2_A$ of the switch circuit 20, and hence the amplified voltages AOUT1 and AOUT2 are as follows:

$AOUT1 = \alpha(Va - Voffa1)$, and $AOUT2 = \alpha(Vc - Voffa2)$.

In contrast, in the first half clock interval PN1 in the north pole detection operation, as the switch signal CLT3 becomes the high level, the switch signal switches 61 and 62 are turned on. Therefore, the input terminals $E1_C$ and $E2_C$ of the comparison circuit 70 are supplied with the reference voltages VREF1 and VREF2 as the comparison voltages INC1 and INC2, respectively.

In this way, the capacitor 41 is charged by the difference voltage "VREF1−α(Va−Voffa1)" between the reference voltage VREF1 and the amplified voltage AOUT1, and the capacitor 42 is charged by the difference voltage "VREF2−α(Vc−Voffa2)" between the reference voltage VREF2 and the amplified voltage AOUT2.

After performing the charging described above, in synchronization with the next rising edge of the reference clock signal CLK, levels of the switch signals CLT2 and CTL3 are changed from the high level to the low level, and a level of the switch signal CLT1 is changed from the low level to the high level.

When the switch signal CLT1 becomes the high level, the switch circuit 20 becomes the first switched state. When the switch circuit 20 becomes the first switched state, the voltages Vb and Vd at the terminals B and D of the Hall element 10 are applied to the output terminals $E1_A$ and $E2_A$ of the switch circuit 20, and hence the amplified voltages AOUT1 and AOUT2 are expressed as follows:

$AOUT1 = \alpha(Vb - Voffa1)$, and $AOUT2 = \alpha(Vd - Voffa2)$.

In contrast, in the second half clock interval PN2 in the north pole detection operation, as the switch signal CLT3 becomes the low level, the switches 61 and 62 are turned off.

As charges of the capacitors 41 and 42 are maintained, the comparison voltages INC1 and INC2 in the second half clock interval PN2 are expressed by the following equations (3) and (4), respectively. These comparison voltages INC1 and INC2 do not contain the offset voltages Voffa1 and Voffa2 of the amplifying circuits 31 and 32, which are cancelled by each other.

$$INC1 = VREF1 - \alpha(Va - Voffa1) + \alpha(Vb - Voffa1) \qquad (3)$$
$$= VREF1 - \alpha(Va - Vb)$$

$$INC2 = VREF2 - \alpha(Vc - Voffa2) + \alpha(Vd - Voffa2) \qquad (4)$$
$$= VREF2 - \alpha(Vc - Vd)$$

The left side half of FIG. 7 shows signal waveforms when the north pole magnetic field having a predetermined reference intensity or more is applied to the Hall element 10. In this case, "INC1>INC2" holds in the second half clock interval PN2 in the north pole detection operation, and the comparison result signal COUT at the high level is output. When the north pole magnetic field having a predetermined reference intensity or more is not applied to the Hall element 10, "INC1>INC2" does not hold in the second half clock interval PN2 in the north pole detection operation, and the comparison result signal COUT at the low level is output. As an example, the right side half of FIG. 7 shows signal waveforms when the south pole magnetic field is applied to the Hall element 10.

In the difference voltage between the comparison voltages INC1 and INC2 (i.e. in the stage of comparing the comparison voltages INC1 and INC2), the element offset voltage is cancelled as described above in the description of the south pole detection operation.

The control circuit 80 sets the output signal LOUT2 to the high level as a rule, determines that the north pole is detected in the north pole detection operation if the comparison result signal COUT in the second half clock interval PN2 in the north pole detection operation is at the high level, and sets the output signal LOUT2 to the low level. After the output signal LOUT2 is set to the low level, the low level of the output signal LOUT2 is maintained until the third or fourth condition described below is satisfied. When at least one of the third and fourth conditions is satisfied, the output signal LOUT2 is restored to the high level. The third condition is that the north pole is not detected in the north pole detection operation that will be performed later. The fourth condition is that the south pole is detected in the south pole detection operation that will be performed later.

[Operational Flowchart]

Figure 8:
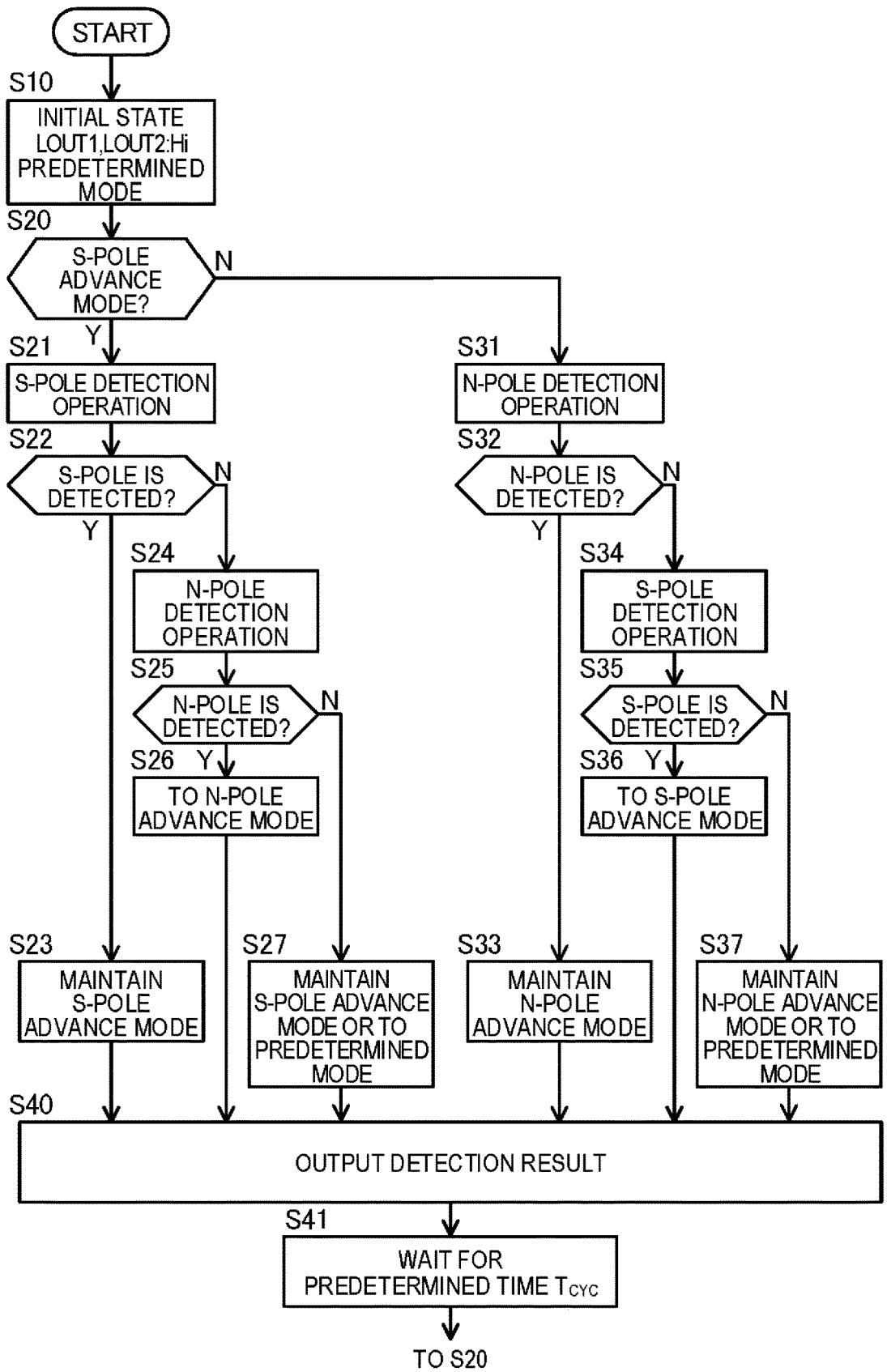
FIG. 8 is an operational flowchart of the magnetic sensor according to the embodiment of the present invention.

With reference to FIG. 8, an operation flow of the magnetic sensor 1 is described. When supply of the power supply voltage VDD to the magnetic sensor 1 is started, first in Step S10, the magnetic sensor 1 becomes an initial state. In the initial state of the magnetic sensor 1, the output signals LOUT1 and LOUT2 are at the high level, and the operation mode of the magnetic sensor 1 is a predetermined mode, i.e. one of the south pole advance mode and the north pole advance mode. Each operation after Step S20 following Step S10 is performed under control by the control circuit 80. The operation mode of the magnetic sensor 1, which is set as one of the south pole advance mode and the north pole advance mode, is determined based on a state of the logical circuit included in the control circuit 80. Therefore, it can be considered that the control circuit 80 sets the operation mode of the magnetic sensor 1.

In Step S20, the operation mode of the magnetic sensor 1 is checked. If the operation mode of the magnetic sensor 1 is set to the south pole advance mode, the process proceeds to Step S21. In contrast, if the operation mode of the magnetic sensor 1 is set to the north pole advance mode, the process proceeds to Step S31.

In Step S21, the control circuit 80 supplies the signals CTL1 to CTL3 and POW for realizing the south pole detection operation to the detection block (detection circuit), so that the detection block performs the south pole detection operation.

The detection block means a circuit block in the magnetic sensor 1 until the comparison result signal COUT is derived. In the circuit example of FIG. 3, the detection block includes structural elements such as the switch circuit 20, the amplifying circuit portion 30, the capacitors 41 and 42, the reference voltage generating circuit 50, the switches 61 and 62, the comparison circuit 70, and the switch 71. It is supposed here that the structural elements of the detection block do not include the Hall element 10, but it may be possible to consider that the structural elements include the Hall element 10, too. In any case, the detection block can perform the south pole detection operation and the north pole detection operation using the output signal of the Hall element 10 (Va, Vb, Vc, Vd) under control by the control circuit 80. In other words, the detection block can distinguish and detect the south pole magnetic field and the north pole magnetic field using the output signal of the Hall element 10 (Va, Vb, Vc, Vd) under control by the control circuit 80. It can be considered that the detection block (detection circuit) and the control circuit 80 form the signal processing circuit.

If the south pole is detected (i.e. if presence of detection of the south pole is determined) in the south pole detection operation of Step S21, the south pole advance mode is maintained (Y in Step S22, and S23), the north pole detection operation is not performed, and the process proceeds to Step S40. In contrast, if the south pole is not detected (i.e. if absence of detection of the south pole is determined) in the south pole detection operation of Step S21, the process proceeds to Step S24.

In Step S24, the control circuit 80 supplies signals CTL1 to CTL3 and POW for realizing the north pole detection operation to the detection block, so that the detection block performs the north pole detection operation. If the north pole is detected (i.e. if presence of detection of the north pole is determined) in the north pole detection operation of Step S24, the operation mode of the magnetic sensor 1 is changed from the south pole advance mode to the north pole advance mode (Y in Step S25, S26), and the process proceeds to Step S40. In contrast, if the north pole is not detected (i.e. absence of detection of the north pole is determined) in the north pole detection operation of Step S24, the process proceeds to Step S27 via Step S25. In Step S27, the operation mode of the magnetic sensor 1 is maintained in the south pole advance mode or is set to a predetermined mode, i.e. one of the south pole advance mode and the north pole advance mode, and then the process proceeds to Step S40.

In Step S31, the control circuit 80 supplies the signals CTL1 to CTL3 and POW for realizing the north pole detection operation to the detection block, so that the detection block performs the north pole detection operation.

If the north pole is detected (i.e. if presence of detection of the north pole is determined) in the north pole detection operation of Step S31, the north pole advance mode is maintained (Y in Step S32, S33), the south pole detection operation is not performed, and the process proceeds to Step S40. In contrast, if the north pole is not detected (i.e. if absence of detection of the north pole is determined) in the north pole detection operation of Step S31, the process proceeds to Step S34.

In Step S34, the control circuit 80 supplies the signals CTL1 to CTL3 and POW for realizing the south pole detection operation to the detection block, so that the detection block performs the south pole detection operation. If the south pole is detected (i.e. if presence of detection of the south pole is determined) in the south pole detection operation of Step S34, the operation mode of the magnetic sensor 1 is changed from the north pole advance mode to the south pole advance mode (Y in Step S35, S36), and the process proceeds to Step S40. In contrast, if the south pole is not detected (i.e. if absence of detection of the south pole is determined) in the south pole detection operation of Step S34, the process proceeds to Step S37 via Step S35. In Step S37, the operation mode of the magnetic sensor 1 is maintained in the north pole advance mode or is set to a predetermined mode, i.e. one of the south pole advance mode and the north pole advance mode, and then the process proceeds to Step S40.

The process from Step S20 to just before Step S40 is repeatedly performed as a unit process at the interval based on a waiting process in Step S41. In Step S40, the output signals LOUT1 and LOUT2 corresponding to results of the south pole detection operation and the north pole detection operation in the last unit process are output. The last unit process may include only one of the south pole detection operation and the north pole detection operation. Specifically, the process is performed as follows.

If the south pole is detected in the south pole detection operation of Step S21, the output signal LOUT1 is set to the low level while the output signal LOUT2 is set to the high level in Step S40.

If the south pole is not detected in the south pole detection operation of Step S21 and if the north pole is detected in the north pole detection operation of Step S24, the output signal LOUT1 is set to the high level while the output signal LOUT2 is set to the low level in Step S40.

If the south pole is not detected in the south pole detection operation of Step S21 and if the north pole is not detected in the north pole detection operation of Step S24, both of the output signals LOUT1 and LOUT2 are set to the high level in Step S40.

If the north pole is detected in the north pole detection operation of Step S31, the output signal LOUT1 is set to the high level while the output signal LOUT2 is set to the low level in Step S40.

If the north pole is not detected in the north pole detection operation of Step S31 and if the south pole is detected in the south pole detection operation of Step S34, the output signal LOUT1 is set to the low level while the output signal LOUT2 is set to the high level in Step S40.

If the north pole is not detected in the north pole detection operation of Step S31 and if the south pole is not detected in the south pole detection operation of Step S34, both the output signals LOUT1 and LOUT2 are set to the high level in Step S40.

In Step S41 after Step S40, elapse of a predetermined time $T_{CYC}$ is waited, and then the process returns to Step S20. This waiting is realized by, for example, counting a reference clock signal CLK of a predetermined number of clocks. The predetermined time $T_{CYC}$ corresponds to an interval between execution timings of the i-th and (i+1)th unit operations (i is a natural number).

Note that for convenience sake of description, the flowchart is described above in which the process of Step S40 is performed after the process of maintaining or changing the operation mode. However, a before-and-after relationship between the former process and the latter process is arbitrary, and basically the processes may be performed in parallel. In addition, if the south pole is not detected in the south pole detection operation of Step S21 (N in Step S22), the output signal LOUT1 may be set to the high level without waiting for the north pole detection operation of Step S24. In the same manner, if the north pole is not detected in the north pole detection operation of Step S31 (N in Step S32), the output signal LOUT2 may be set to the high level without waiting for the south pole detection operation of Step S34.

[State Transition]

Figure 9:
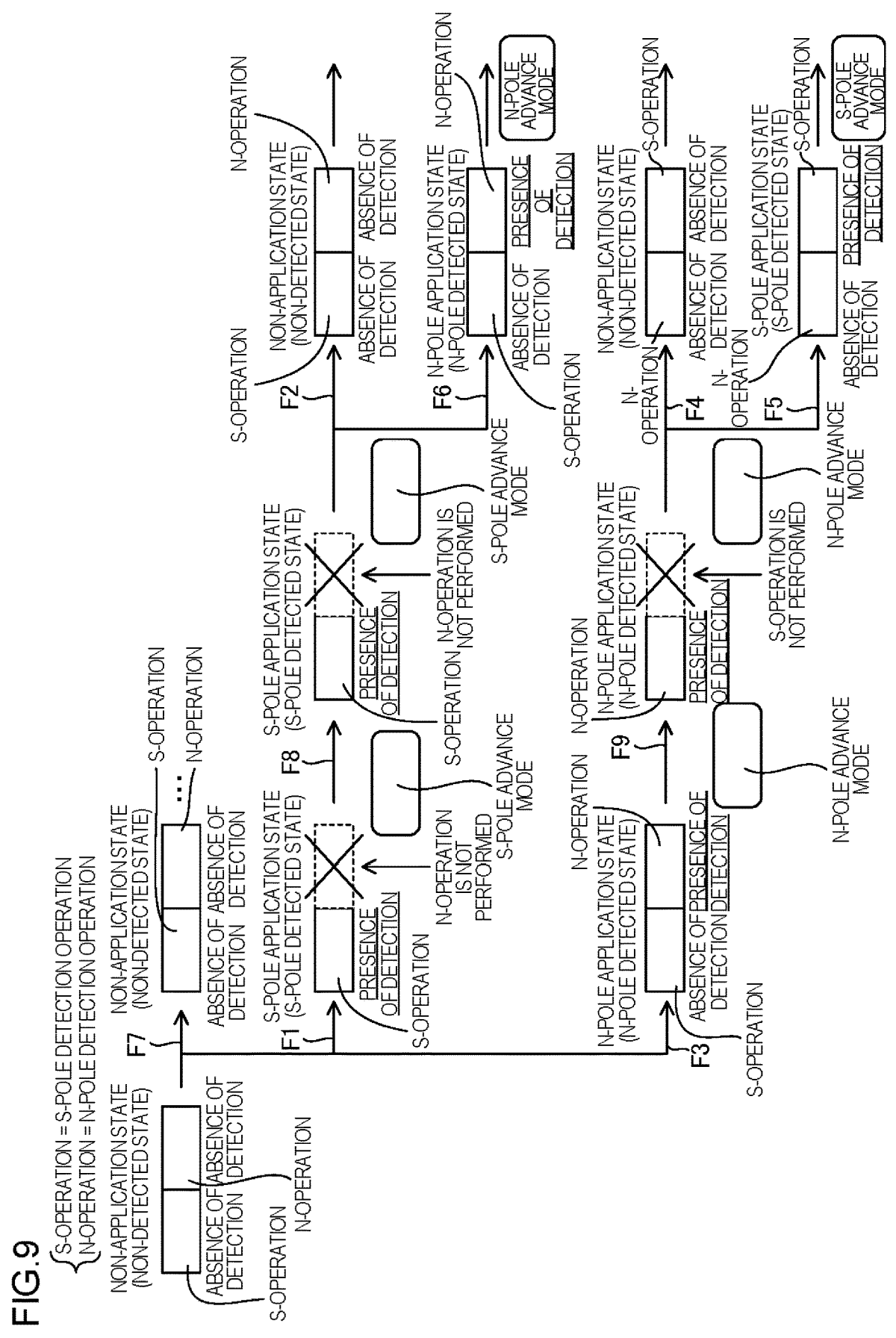

With reference to FIGS. 9 and 10, content control of each unit operation associated with a state transition related to the magnetic field is described. FIG. 11 is a state transition diagram related to the magnetic field. In each unit operation, there is a case where the second detection operation is performed after the first detection operation and a case where only the first detection operation is performed. In each unit operation, there is no case where only the second detection operation is performed or the second detection operation is performed before the first detection operation. As understood from the above description, the first detection operation and the second detection operation are the south pole detection operation and the north pole detection operation, respectively in the south pole advance mode, while they are the north pole detection operation and the south pole detection operation, respectively, in the north pole advance mode.

The state where the south pole magnetic field having a predetermined reference intensity or more is applied to the Hall element 10 is referred to as the south pole application state, and the state where the north pole magnetic field having a predetermined reference intensity or more is applied to the Hall element 10 is referred to as the north pole application state. A state where the south pole is detected by the magnetic sensor 1 (a state where presence of detection of the south pole is determined) is referred to as a south pole detected state, and a state where the north pole is detected by the magnetic sensor 1 (a state where presence of detection of the north pole is determined) is referred to as a north pole detected state. When the unit operation is performed in the south pole application state, the south pole detected state occurs. When the unit operation is performed in the north pole application state, the north pole detected state occurs. A state where neither the south pole magnetic field having a predetermined reference intensity or more nor the north pole magnetic field having a predetermined reference intensity or more is applied to the Hall element 10 is referred to as a non-application state. When the unit operation is performed in the non-application state, a non-detected state occurs in which neither the south pole nor the north pole is detected.

There are state transitions F1 to F9 as types of the state transition related to the magnetic field.

F1 is a state transition from the non-application state and the non-detected state to the south pole application state and the south pole detected state.

F2 is a state transition from the south pole application state and the south pole detected state to the non-application state and the non-detected state.

F3 is a state transition from the non-application state and the non-detected state to the north pole application state and the north pole detected state.

F4 is a state transition from the north pole application state and the north pole detected state to the non-application state and the non-detected state.

F5 is a state transition from the north pole application state and the north pole detected state to the south pole application state and the south pole detected state.

F6 is the a transition from the south pole application state and the south pole detected state to the north pole application state and the north pole detected state.

A state transition F7 corresponds to a state where the non-application state and the non-detected state is maintained, and it also can be considered as a transition from the non-application state and the non-detected state to the non-application state and the non-detected state.

A state transition F8 corresponds to a state where the south pole application state and the south pole detected state is maintained, and it also can be considered as a transition from the south pole application state and the south pole detected state to the south pole application state and the south pole detected state.

A state transition F9 corresponds to a state where the north pole application state and the north pole detected state is maintained, and it also can be considered as a transition from the north pole application state and the north pole detected state to the north pole application state and the north pole detected state.

The non-application state and the non-detected state at the left end in FIG. 9 is regarded as a start point. In the non-detected state, the operation mode of the magnetic sensor 1 may be the north pole advance mode, but it is supposed here that the operation mode is the south pole advance mode. Then, the north pole detection operation is performed after the south pole detection operation in the unit operation in the non-application state, and neither the south pole nor the north pole is detected. After that, if the non-application state is maintained when the next unit operation is performed (state transition F7), the north pole detection operation is performed after the south pole detection operation also in the next unit operation, and neither the south pole nor the north pole is detected again. As a result, the non-detected state is maintained.

A situation in which the non-application state to be the start point is changed to the south pole application state is considered. When the non-application state is changed to the south pole application state, the state transition F1 is generated. In the unit operation just after the non-application state is changed to the south pole application state, the south pole is detected in the south pole detection operation as the first detection operation, and hence the north pole detection operation as the second detection operation is not performed. By the state transition F1, the operation mode of the magnetic sensor 1 is set to the south pole advance mode.

When the south pole application state is maintained after the state transition F1, the state transition F8 is generated. In the unit operation in which the south pole application state is maintained, the south pole is detected in the south pole detection operation as the first detection operation, and hence the north pole detection operation as the second detection operation is not performed, and the south pole advance mode is maintained on the basis that the south pole detection is maintained.

When the non-application state is generated after the state transition F8, the state transition F2 occurs. In the unit operation just after the south pole application state is changed to the non-application state, the south pole is not detected in the south pole detection operation as the first detection operation, and hence the north pole detection operation is performed next as the second detection operation, but the north pole is also not detected. As a result, the state of the magnetic sensor 1 becomes the non-detected state. The operation mode of the magnetic sensor 1 after being the non-detected state via the state transition F2 may be the south pole advance mode as the operation mode before the state transition F2, or may be a predetermined operation mode, i.e. one of the south pole advance mode and the north pole advance mode.

When the north pole application state is generated after the state transition F8, the state transition F6 occurs. In the unit operation just after the south pole application state is changed to the north pole application state, the south pole is not detected in the south pole detection operation as the first detection operation, and hence the north pole detection operation is performed next as the second detection operation, so that the north pole is detected. As a result, the state of the magnetic sensor 1 becomes the north pole detected state, and the operation mode of the magnetic sensor 1 is set to the north pole advance mode.

Next, a situation in which the non-application state to be the start point (corresponding to the left end in FIG. 9) is changed to the north pole application state is considered. When the non-application state is changed to the north pole application state, the state transition F3 is generated. In the unit operation just after the non-application state is changed to the north pole application state, the south pole is not detected in the south pole detection operation as the first detection operation, and hence the north pole detection operation is performed next as the second detection operation, so that the north pole is detected. As a result, the state of the magnetic sensor 1 becomes the north pole detected state, and the operation mode of the magnetic sensor 1 is set to the north pole advance mode.

When the north pole application state is maintained after the state transition F3, the state transition F9 is generated. In the unit operation in which the north pole application state is maintained, the north pole is detected in the north pole detection operation as the first detection operation, and hence the south pole detection operation as the second detection operation is not performed, and the north pole advance mode is maintained on the basis that the north pole detection is maintained.

When the non-application state occurs after the state transition F9, the state transition F4 is generated. In the unit operation just after the north pole application state is changed to the non-application state, the north pole is not detected in the north pole detection operation as the first detection operation, and hence the south pole detection operation is performed next as the second detection operation, but the south pole is also not detected. As a result, the state of the magnetic sensor 1 becomes the non-detected state. The operation mode of the magnetic sensor 1 after becoming the non-detected state via the state transition F4 may be the north pole advance mode as the operation mode before the state transition F4, or may be a predetermined operation mode, i.e. one of the south pole advance mode and the north pole advance mode.

When the south pole application state occurs after the state transition F9, the state transition F5 is generated. In the unit operation just after the north pole application state is changed to the south pole application state, the north pole is not detected in the north pole detection operation as the first detection operation, and hence the south pole detection operation is performed next as the second detection operation, so that the south pole is detected. As a result, the state of the magnetic sensor 1 becomes the south pole detected state, and the operation mode of the magnetic sensor 1 is set to the south pole advance mode.

Signal Waveform Example

Behaviors of signals in the south pole and the north pole detection operations are described above with reference to FIGS. 6 and 7. Some examples of signal waveforms of the magnetic sensor 1 in the unit operation are described below.

Figure 12:
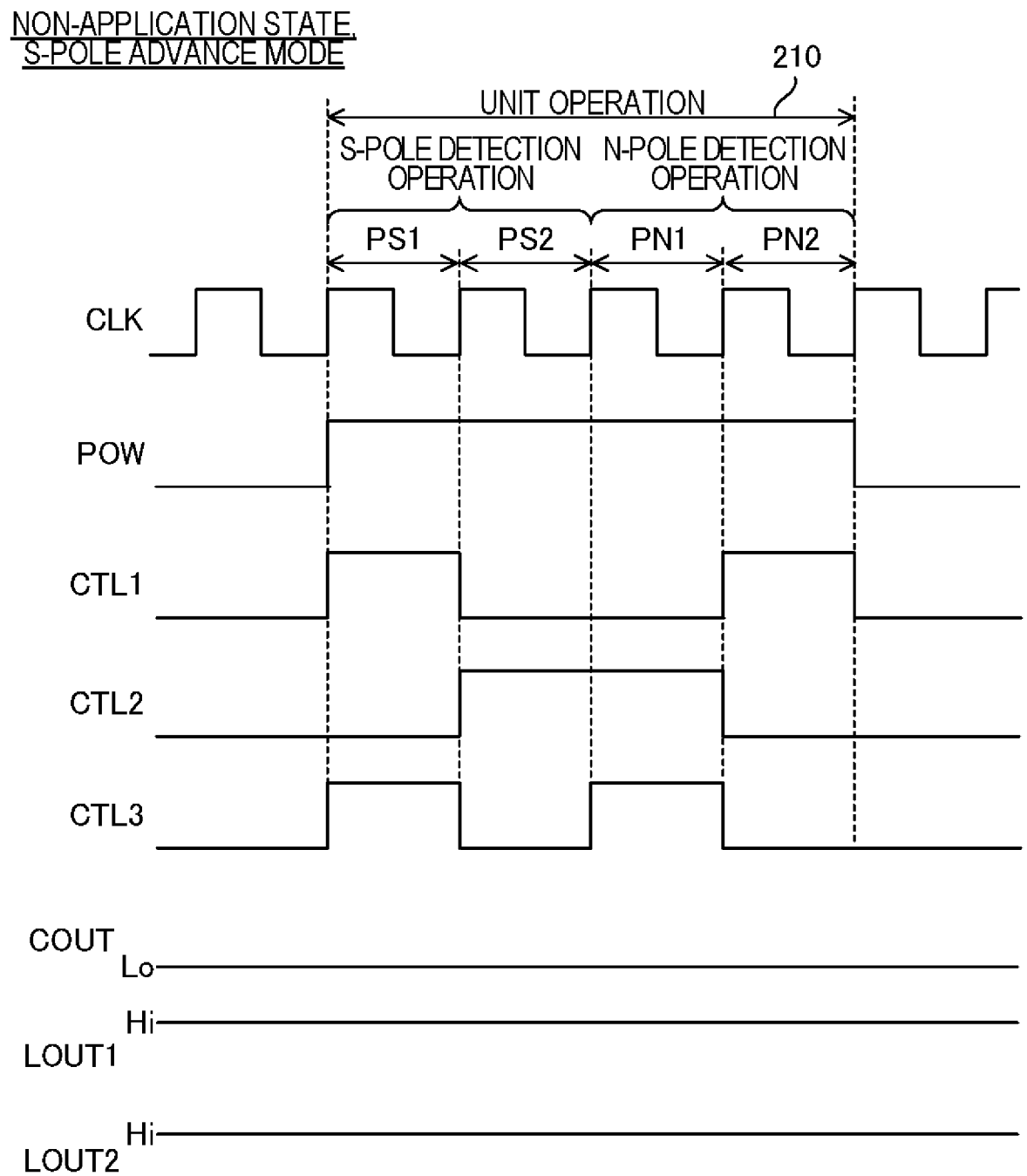
FIG. 12 is a diagram showing signal waveforms in the magnetic sensor according to the embodiment of the present invention (conditions: a non-application state, a south pole advance mode).

FIG. 12 shows signal waveforms of the magnetic sensor 1 in a unit operation 210 performed in the south pole advance mode in the non-application state. In the unit operation 210, the south pole detection operation is performed as the first detection operation in the clock intervals PS1 and PS2. As the south pole is not detected (as the comparison result signal COUT becomes the low level in the second half clock interval PS2), the north pole detection operation is performed as the second detection operation next in the clock intervals PN1 and PN2, so that the north pole is also not detected (the comparison result signal COUT becomes the low level in the second half clock interval PN2). The unit operation 210 is constituted of the four continuous clock intervals PS1, PS2, PN1 and PN2, and the power supply on signal POW is at the high level in the four clock intervals.

Figure 13:
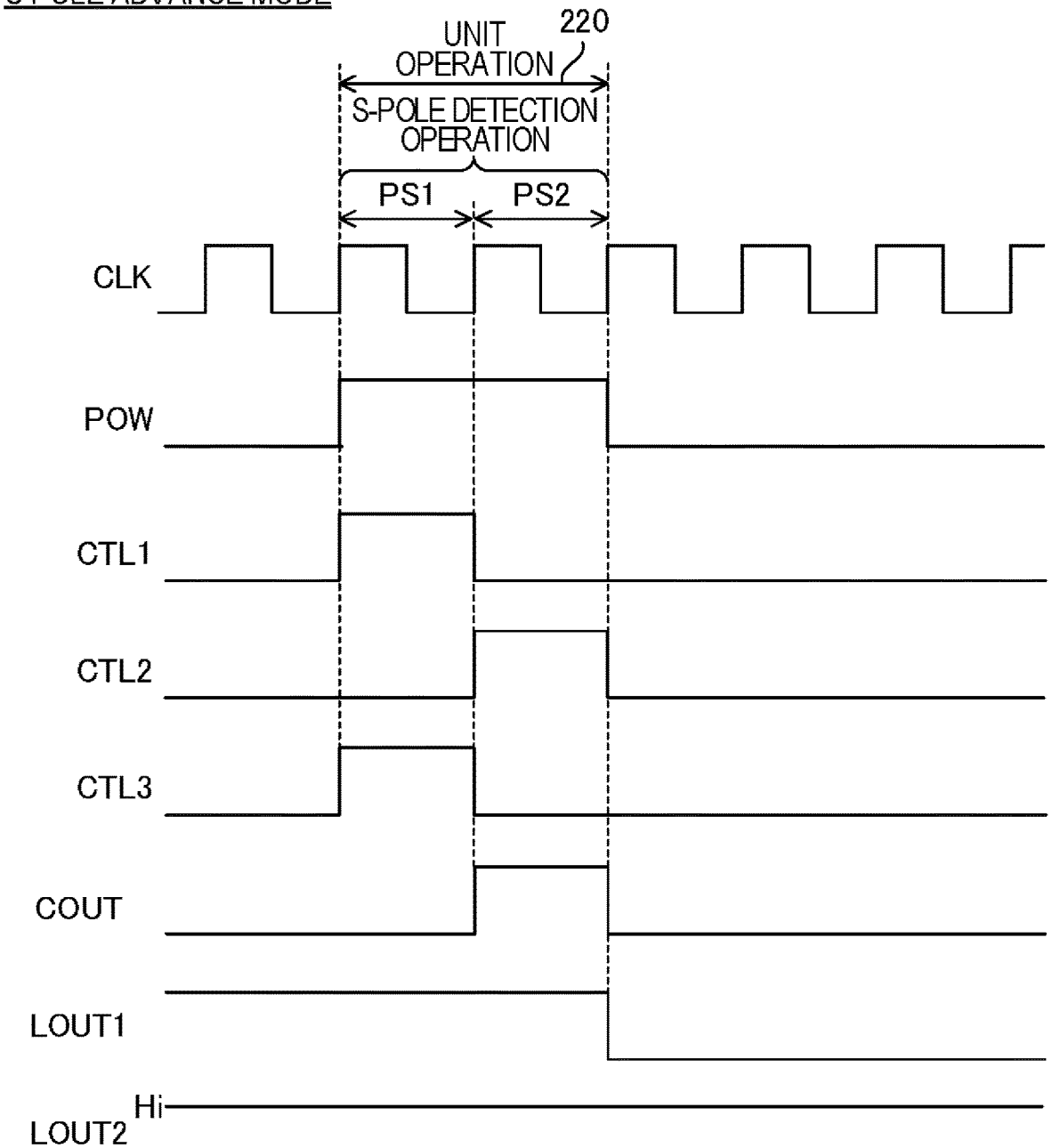
FIG. 13 is a diagram showing signal waveforms in the magnetic sensor according to the embodiment of the present invention (conditions: a south pole application state, the south pole advance mode).

FIG. 13 shows signal waveforms of the magnetic sensor 1 in a unit operation 220 performed in the south pole advance mode in the south pole application state. In the unit operation 220, the south pole is detected by the south pole detection operation performed in the clock intervals PS1 and PS2 as the first detection operation (the comparison result signal COUT becomes the high level in the second half clock interval PS2), and hence the unit operation 220 is finished without performing the north pole detection operation as the second detection operation. The unit operation 220 is constituted of the two continuous clock intervals PS1 and PS2, and the power supply on signal POW is at the high level in the two clock intervals.

Figure 14:
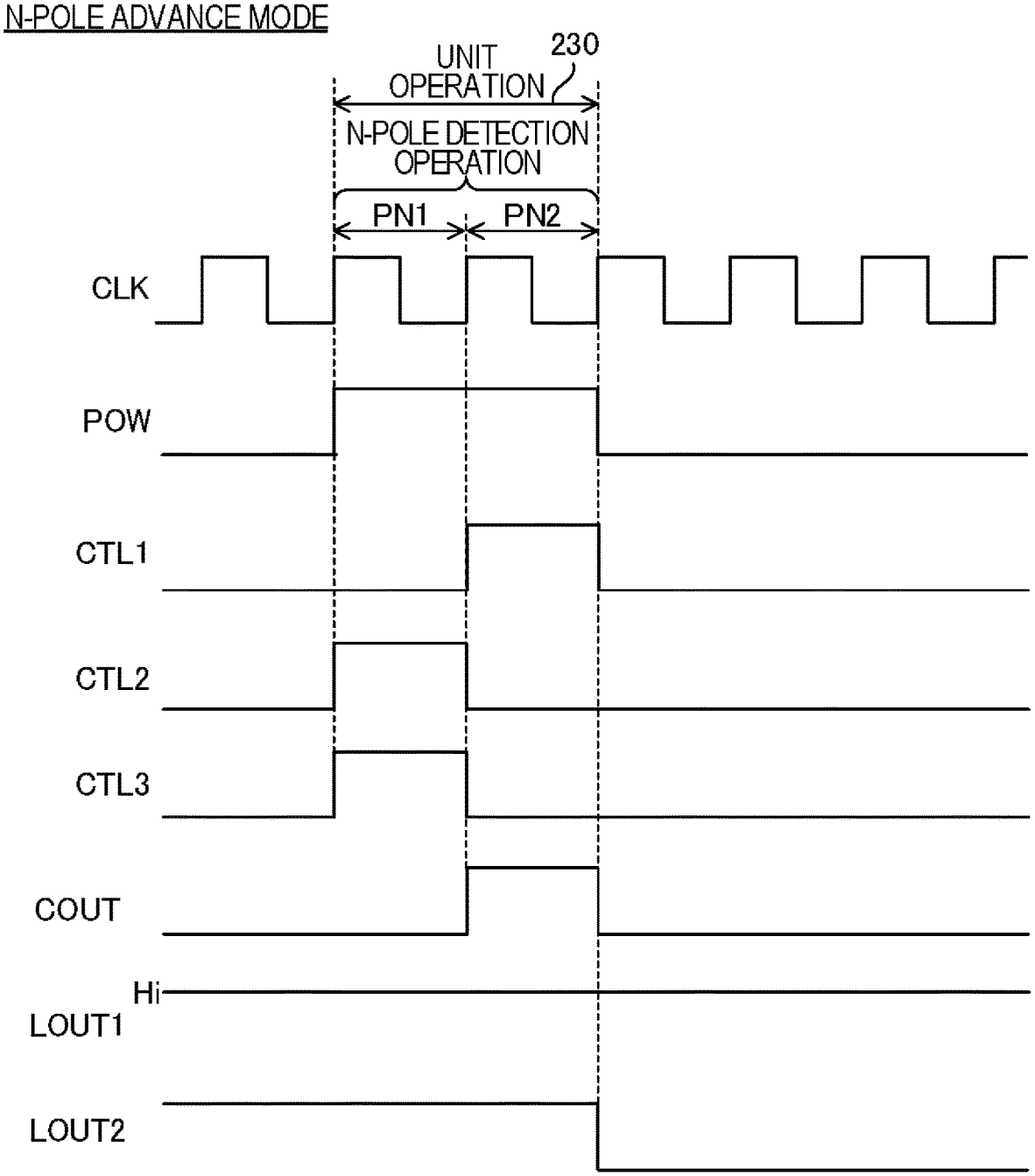
FIG. 14 is a diagram showing signal waveforms in the magnetic sensor according to the embodiment of the present invention (conditions: a north pole application state, a north pole advance mode).

FIG. 14 shows signal waveforms of the magnetic sensor 1 in a unit operation 230 performed in the north pole advance mode in the north pole application state. In the unit operation 230, the north pole is detected by the north pole detection operation performed in the clock intervals PN1 and PN2 as the first detection operation (the comparison result signal COUT becomes the high level in the second half clock interval PN2), and hence the unit operation 230 is finished without performing the south pole detection operation as the second detection operation. The unit operation 230 is constituted of the two continuous clock intervals PN1 and PN2, and the power supply on signal POW is at the high level in the two clock intervals.

The example of the structure and the operation described above according to this embodiment is referred to as a basic example for convenience sake. Variation techniques and application techniques based on the basic example are described in a plurality of examples below. Unless otherwise noted and as long as no contradiction occurs, descriptions in the basic example are applied to each example described later, and if each example has a contradiction with the basic example, description in each example takes a priority. In addition, as long as no contradiction occurs, description in any one of examples described below can be applied to any other example (i.e. any two or more examples among the plurality of examples can be combined with each other).

First Example

A first example is described. The reference intensity described above is determined by the difference voltage VREF between the reference voltages VREF1 and VREF2 (=VREF2−VREF1). The difference voltage VREF that is used in the south pole detection operation and the difference voltage VREF that is used in the north pole detection operation may be identical to each other or may be different from each other as specific voltage values. In addition, VREF may have a hysteresis characteristic.

Figure 15:
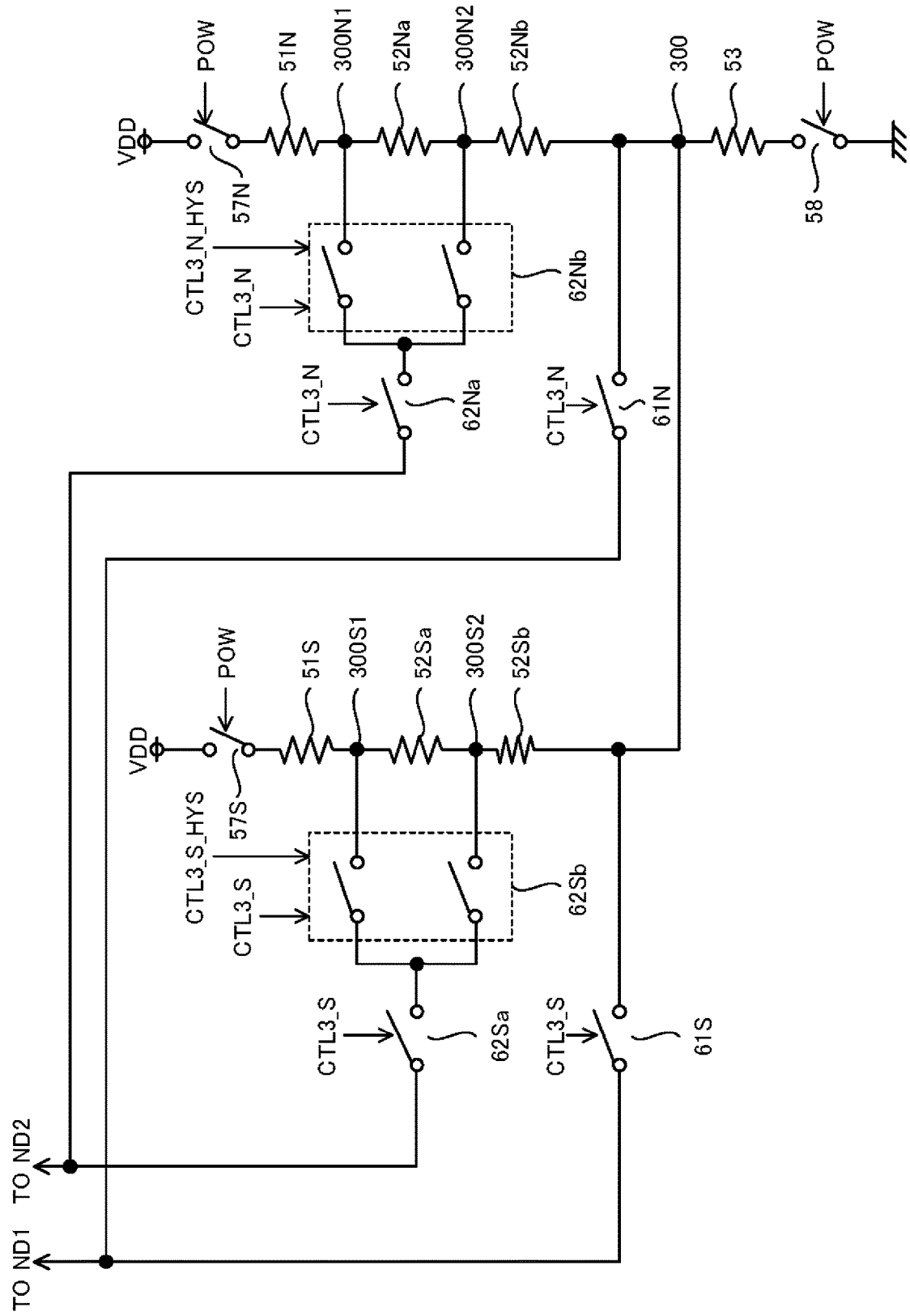
FIG. 15 is a diagram illustrating a reference voltage generating circuit and its peripheral circuit according to a first example of the present invention.

FIG. 15 illustrates a circuit example that realizes the hysteresis characteristic and enables the difference voltage VREF to differ between the south pole detection operation and the north pole detection operation.

The switches 61 and 62 illustrated in FIG. 3 constitute a reference voltage supply switch circuit that switches whether or not to supply the reference voltages VREF1 and VREF2 to the nodes ND1 and ND2, respectively. When adopting the circuit of FIG. 15, instead of the switches 61 and 62, the reference voltage supply switch circuit including switches 61S, 62Sa, 62Sb, 61N, 62Na and 62Nb is disposed in the magnetic sensor 1. In addition, as structural elements of the reference voltage generating circuit 50, voltage dividing resistors 51S, 52Sa, 52Sb, 51N, 52Na, 52Nb and 53 and switches 57S, 57N and 58 are disposed in the magnetic sensor 1.

The circuit of FIG. 15 includes first and second voltage dividing circuits disposed between the ground and the terminal applied with the power supply voltage VDD. The first voltage dividing circuit includes the switch 57S, the voltage dividing resistors 51S, 52Sa, 52Sb and 53, and the switch 58, which are connected in series in order from the terminal applied with the power supply voltage VDD to the ground. The second voltage dividing circuit includes the switch 57N, the voltage dividing resistors 51N, 52Na, 52Nb and 53, and the switch 58, which are connected in series in order from the terminal applied with the power supply voltage VDD to the ground. Although the voltage dividing resistor 53 and the switch 58 are shared by the first and second voltage dividing circuit, sharing of components between the first and second voltage dividing circuits is not essential.

The connection node between the voltage dividing resistors 51S and 52Sa, and the connection node between the voltage dividing resistors 52Sa and 52Sb are referred to as a node 300S1 and a node 300S2, respectively. The connection node between the voltage dividing resistors 51N and 52Na, and the connection node between the voltage dividing resistors 52Na and 52Nb are referred to as a node 300N1, and a node 300N2, respectively. The connection node between the voltage dividing resistors 52Sb, 52Nb and 53 is referred to as a node 300.

Only when both the switches 57S and 58 are turned on, which are on-off controlled according to the power supply on signal POW, the power supply voltage VDD is applied to the series circuit of the four voltage dividing resistors constituting the first voltage dividing circuit. In this way, first, second, and third DC voltages corresponding to the power supply voltage VDD are generated at the nodes 300S1, 300S2, and 300, respectively (naturally, "first DC voltage>second DC voltage>third DC voltage" holds). Only when both the switches 57N and 58 are turned on, which are on-off controlled according to the power supply on signal POW, the power supply voltage VDD is applied to the series circuit of the four voltage dividing resistors constituting the second voltage dividing circuit. In this way, fourth, fifth, sixth DC voltages corresponding to the power supply voltage VDD are generated at the nodes 300N1, 300N2, and 300, respectively (naturally, "fourth DC voltage>fifth DC voltage>sixth DC voltage" holds).

Each of the switches 61S and 61N is a switch that switches connection and disconnection between the nodes ND1 and 300. The switches 62Sa and 62Sb constitute a switch that switches among a state where the node ND2 is connected to 300S1, a state where the node ND2 is connected to the 300S2, and a state where the node ND2 is not connected to either 300S1 or 300S2. The switches 62Na and 62Nb constitute a switch that switches among a state where the node ND2 is connected to 300N1, a state where the node ND2 is connected to 300N2, and a state where the node ND2 is not connected to either 300N1 or 300N2.

When the circuit of FIG. 15 is adopted, instead of the switch signal CTL3, switch signals CTL3_S, CTL3_S_HYS, CTL3_N and CTL3_N_HYS are output from the control circuit 80. The switches 61S and 62Sa are on-off controlled according to the switch signal CTL3_S, and the switches 61N and 62Na are on-off controlled according to the switch signal CTL3_N. The switch 62Sb is constituted of a switch disposed between the switch 62Sa and the node 300S1 and a switch disposed between the switch 62Sa and the node 300S2, and the two switches are on-off controlled according to the switch signals CTL3_S and CTL3_S_HYS. The switch 62Nb is constituted of a switch disposed between the switch 62Na and the node 300N1 and a switch disposed between the switch 62Na and the node 300N2, and the two switches are on-off controlled according to the switch signals CTL3_N and CTL3_N_HYS.

Further, the control circuit 80 controls the switches illustrated in FIG. 15 so that the following operation is realized. First, as a basic operation, when performing the south pole detection operation or the north pole detection operation, the power supply on signal POW at the high level is supplied to the switches 57S, 57N and 58 so as to turn on the switches 57S, 57N and 58. In the south pole detection operation, the switches 61N and 62Na and the switches in the switch 62Nb are turned off. In the north pole detection operation, the switches 61S and 62Sa and the switches in the switch 62Sb are turned off. In addition, without depending on the detection result of the last unit operation, when the south pole detection operation is performed, the switch 61S is turned on so that a voltage at the node 300 is applied to the node ND1 as the reference voltage VREF1 in the first half clock interval PS1. In the same manner, without depending on the detection result of the last unit operation, when the north pole detection operation is performed, the switch 61N is turned on so that a voltage at the node 300 is applied to the node ND1 as the reference voltage VREF1 in the first half clock interval PN1.

Further, in order to realize the hysteresis characteristic concerning the south pole detection operation, the switches 62Sa and 62Sb are controlled in such a manner as follows.

In the case where the south pole is not detected in the last unit operation or the north pole is detected in the last unit operation, when the south pole detection operation is performed in the current unit operation, the switches 62Sa and 62Sb are controlled so that a voltage at the node 300S1 is applied to the node ND2 as the reference voltage VREF2 in the first half clock interval PS1.

In the case where the south pole is detected in the last unit operation, when the south pole detection operation is performed in the current unit operation, the switches 62Sa and 62Sb are controlled so that a voltage at the node 300S2 is applied to the node ND2 as the reference voltage VREF2 in the first half clock interval PS1.

In the same manner, in order to realize the hysteresis characteristic concerning the north pole detection operation, the switches 62Na and 62Nb are controlled in such a manner as follows.

In the case where the north pole is not detected in the last unit operation or the south pole is detected in the last unit operation, when the north pole detection operation is performed in the current unit operation, the switches 62Na and 62Nb are controlled so that a voltage at the node 300N1 is applied to the node ND2 as the reference voltage VREF2 in the first half clock interval PN1.

In the case where the north pole is detected in the last unit operation, when the north pole detection operation is performed in the current unit operation, the switches 62Na and 62Nb are controlled so that a voltage at the node 300N2 is applied to the node ND2 as the reference voltage VREF2 in the first half clock interval PN1.

In the second half clock intervals PS2 and PN2, the nodes ND1 and ND2 are separated from the circuit of FIG. 15, and hence a voltage at the node 300 is not applied to the node ND1, and any voltage at the node 300S1, 300S2, 300N1, or 300N2 is not applied to the node ND2.

Second Example

Figure 16:
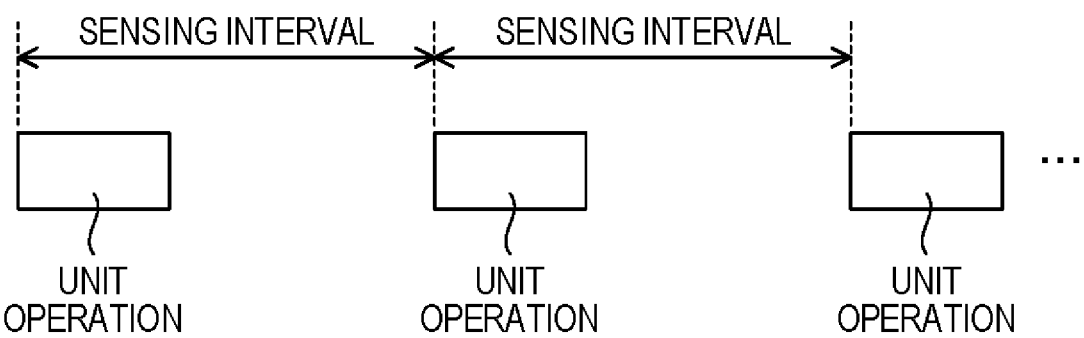
FIG. 16 is a diagram illustrating a manner in which a unit operation is performed repeatedly at a sensing interval according to a second example of the present invention.

A second example is described. The unit operation is performed repeatedly at an interval. A time difference from execution start timing of a certain unit operation to execution start timing of the next unit operation, i.e., an execution interval between neighboring unit operations is referred to as a sensing interval (see FIG. 16). The sensing interval may be fixed to a predetermined interval or may be altered according to a situation.

Specifically, for example, the sensing interval is a predetermined reference sensing interval $INT_{REF}$ as a rule, but the control circuit 80 may alter the sensing interval to an extended sensing interval $INT_L$ longer than the reference sensing interval $INT_{REF}$ in the case where one of the following extension conditions is satisfied. A first extension condition is that the unit operation in which neither the south pole nor the north pole is detected is repeated a predetermined number of times or more (i.e. the non-detected state is maintained in the unit operations of a predetermined number of times). A second extension condition is that the unit operation in which the south pole is detected is repeated a predetermined number of times or more (i.e. the south pole detected state is maintained in the unit operations of a predetermined number of times). A third extension condition is that the unit operation in which the north pole is detected is repeated a predetermined number of times or more (i.e. the north pole detected state is maintained in the unit operations of a predetermined number of times). If a certain detected state continues, it is considered that the detected state is likely to continue thereafter too. Therefore, extension of the sensing interval does not cause a bad influence, and power consumption can be further reduced by extension of the sensing interval.

After setting the sensing interval to the extended sensing interval $INT_L$ when the first extension condition is satisfied, if the south pole or the north pole is detected in a certain unit operation, it is preferred that the control circuit 80 restore the sensing interval to the reference sensing interval $INT_{REF}$. In the same manner, after setting the sensing interval to the extended sensing interval $INT_L$ when the second extension condition is satisfied, if the south pole is not detected in a certain unit operation, it is preferred that the control circuit 80 restore the sensing interval to the reference sensing interval $INT_{REF}$. In the same manner, after setting the sensing interval to the extended sensing interval $INT_L$ when the third extension condition is satisfied, if the north pole is not detected in a certain unit operation, it is preferred that the control circuit 80 restore the sensing interval to the reference sensing interval $INT_{REF}$.

The above description is about the method of extending the sensing interval by only one step from the reference sensing interval $INT_{REF}$ when the first, second or third extension condition is satisfied. However, after the extension by one step, it may be determined whether or not the first, second or third extension condition is satisfied again. If the first, second or third extension condition is satisfied again, the sensing interval may be further extended from the extended sensing interval $INT_L$ (i.e. two steps of extension may be performed). Three or more steps of extension may also be possible in the same manner.

In addition, for example, the control circuit 80 may have a function of counting the sum of the number of times of generation of the state transition F1, the number of times of generation of the state transition F2, the number of times of generation of the state transition F3, the number of times of generation of the state transition F4, the number of times of generation of the state transition F5, and the number of times of generation of the state transition F6, per unit of time. Then, if a reduction condition that the counted sum is a predetermined value or more is satisfied, it is considered that the state transitions F1 to F6 have high frequencies, and that sensing at a small interval is better. Therefore, if the reduction condition is satisfied, the control circuit 80 may alter the sensing interval to a reduction sensing interval $INT_S$ that is shorter than the reference sensing interval $INT_{REF}$.

Also after the sensing interval is set to the reduction sensing interval $INT_S$ when the reduction condition is satisfied, it is monitored whether or not the reduction condition is satisfied. When the reduction condition becomes unsatisfied, the control circuit 80 may restore the sensing interval to the reference sensing interval $INT_{REF}$.

The above description is about the method of reducing the sensing interval by only one step from the reference sensing interval $INT_{REF}$ when the reduction condition is satisfied. However, it may be possible to reduce the sensing interval by two steps or more. In other words, for example, if a first reduction condition is satisfied, which is that the sum is a first predetermined value or more but is smaller than a second predetermined value that is larger than the first predetermined value, the control circuit 80 may alter the sensing interval to a reduction sensing interval $INT_{S1}$ that is smaller than the reference sensing interval $INT_{REF}$. If a second reduction condition is satisfied, which is that the sum is the second predetermined value or more, the control circuit 80 may alter the sensing interval to a reduction sensing interval $INT_{S2}$ that is smaller than the reduction sensing interval $INT_{S1}$. Three or more steps of reduction may also be possible in the same manner.

Third Example

Figure 17A:
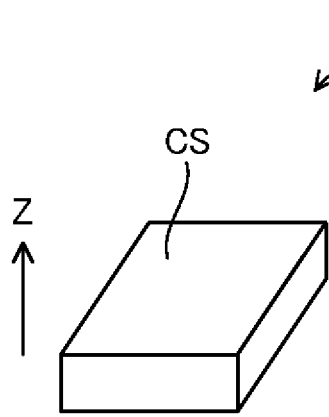
FIGS. 17A and 17B are external perspective views of a magnetic sensor IC according to a third example of the present invention.
Figure 17B:
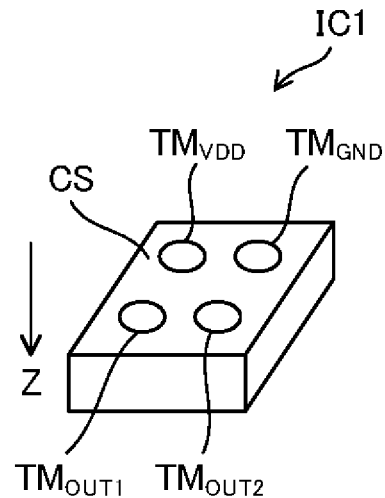

A third example is described. It is possible to form the magnetic sensor 1 as a semiconductor integrated circuit (i.e. to form the structural elements of the magnetic sensor 1 as semiconductor integrated circuits), and to form a semiconductor device with a resin-made case CS (package) in which the semiconductor integrated circuits is enclosed. FIGS. 17A and 17B are external perspective views of a magnetic sensor IC1 that is the semiconductor device. The case CS of the magnetic sensor IC1 has a schematically rectangular solid shape. One surface of the case CS having the rectangular solid shape functions as a front surface, and the other surface opposed to the front surface functions as a rear surface. FIG. 17A is an external perspective view of the magnetic sensor IC1 viewed from the front surface side, and FIG. 17B is an external perspective view of the magnetic sensor IC1 viewed from the rear surface side.

The rear surface of the case CS of the magnetic sensor IC1 is provided with, in addition to the external output terminals $TM_{OUT1}$ and $TM_{OUT2}$, a power supply input terminal $TM_{VDD}$ to be supplied with the power supply voltage VDD and a ground terminal $TM_{GND}$ to be connected to the ground having a reference potential of 0 V (volts), in an exposed manner. It may be possible to provide the case CS with four metal terminals protruding from the case CS, as the terminals $TM_{OUT1}$, $TM_{OUT2}$, $TM_{VDD}$ and $TM_{GND}$.

The Z axis illustrated in FIG. 1A and the like is parallel to the direction connecting the front surface and the rear surface of the case CS. However, a relationship between the case CS and the Z axis may be arbitrary.

Note that instead of the external output terminals $TM_{OUT1}$ and $TM_{OUT2}$, only a single external output terminal $TM_{OUT}$ may be disposed to the case CS. In this case, the control circuit 80 can output a signal LOUT based on the signals LOUT1 and LOUT2 from the external output terminal $TM_{OUT}$. The signal LOUT is at the high level only in the non-detected state and is at the low level in the south pole detected state or in the north pole detected state.

Fourth Example

A fourth example is described. The magnetic sensor according to the present invention can be used in a wide range of applications such as an opening/closing detection sensor of a folding type mobile phone, an opening/closing detection sensor of a cover or a door, a rotation position detection sensor of a motor, and a rotation operation detection sensor of a dial. The magnetic sensor can be mounted in various electric devices corresponding to the applications. In other words, for example, when the magnetic sensor is used as the opening/closing detection sensor of a folding type mobile phone, it is sufficient to mount the magnetic sensor according to the present invention in the mobile phone. When the magnetic sensor is used as the opening/closing detection sensor of a cover of a tablet type or a note type personal computer, it is sufficient to mount the magnetic sensor of the present invention in the personal computer.

In the fourth example, as a specific example, a structure in which the magnetic sensor 1 is mounted in a tablet type personal computer (hereinafter abbreviated as PC) is described.

FIGS. 18A and 18B are respectively an external perspective view and an external side view of a tablet type PC 400 according to the fourth example. The PC 400 includes a main body portion 410, and a cover portion 420a attached to the main body portion 410 via a hinge portion 405 in an openable and closable manner. The main body portion 410 has a case having a substantially rectangular solid shape, and a front surface of the case is provided with a display portion 431 having a display screen such as a liquid crystal display panel. In addition, the magnetic sensor 1 is disposed in the case of the main body portion 410. The magnetic sensor 1 can be mounted in the main body portion 410 in a form of the magnetic sensor IC1 illustrated in FIGS. 17A and 17B. The cover portion 420 is a substantially plate-like lid. A user of the PC 400 can rotate the cover portion 420 about the hinge portion 405 so that the cover portion 420 is made to be either a closed state or an opened state.

When the cover portion 420 is in the closed state, the display screen is covered with the cover portion 420, and hence the user cannot see the display screen and cannot operate a touch panel for input by touching the display screen. In contrast, when the cover portion 420 is in the opened state, the user can see the display screen and can operate the touch panel.

Figure 23:
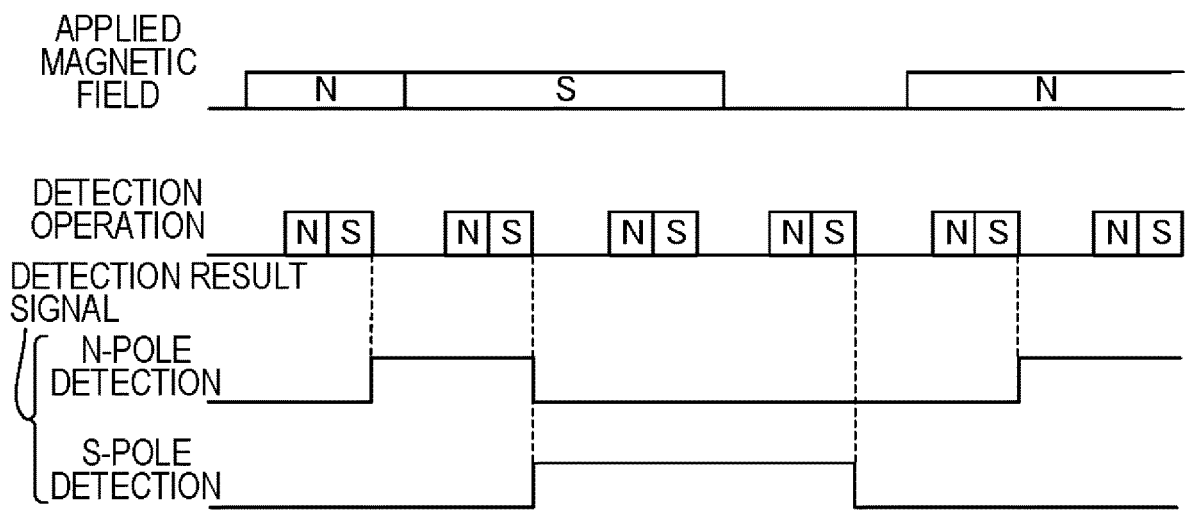
FIG. 23 is a diagram illustrating an operation of a conventional magnetic sensor.

FIGS. 19A and 19B are side views of the PC 400 when the cover portion 420 is in the closed state and in the opened state, respectively. Note that the states of FIGS. 18A and 18B are also the opened state. The magnet MG constituted of one or more permanent magnets are embedded in the cover portion 420. The magnet MG is disposed in the cover portion 420 so that the south pole or the north pole is detected in the unit operation of the magnetic sensor 1 based on the magnetic field of the magnet MG only when the cover portion 420 is in the closed state. In this way, when the cover portion 420 is in the closed state, the magnetic sensor 1 performs only one of the south pole detection operation and the north pole detection operation in the unit operation. Thus, power consumption of the magnetic sensor 1 can be reduced to half of that in the conventional method illustrated in FIG. 23.

Figure 20:
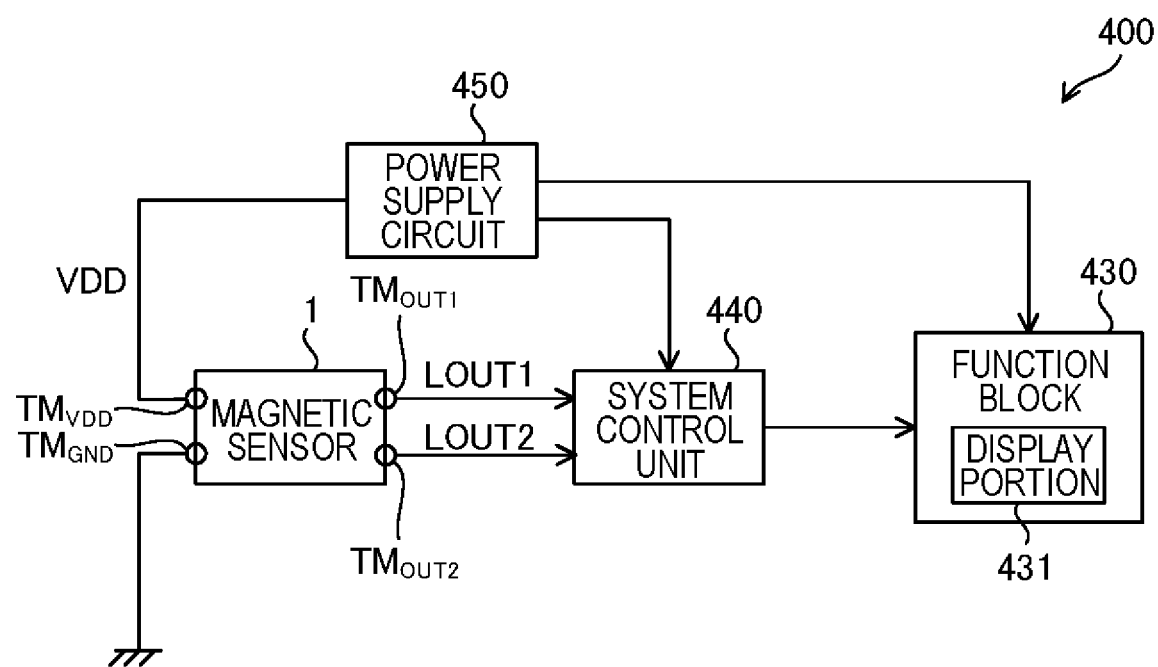
FIG. 20 is a schematic electrical structural diagram of the PC according to the fourth example of the present invention.

FIG. 20 is an electrical schematic structural diagram of the PC 400. The PC 400 includes the magnetic sensor 1, a function block 430 including the display portion 431, a system control unit 440 including a microcomputer and the like, and a power supply circuit 450 that supplies the magnetic sensor 1, the function block 430, and the system control unit 440 with power supply voltages (the power supply voltage VDD for the magnetic sensor 1). Under control by the system control unit 440, the function block 430 can realize various functions such as displaying an image in the display screen on the display portion 431, and turning on a backlight of the display portion 431.

The system control unit 440 is connected to the external output terminals $TM_{OUT1}$ and $TM_{OUT2}$ of the magnetic sensor 1, so as to receive a magnetic field detection result signal of the magnetic sensor 1 from the magnetic sensor 1 via the terminals. The detection result signal is constituted of the signals LOUT1 and LOUT2. However, as described above in the third example, if the magnetic sensor 1 has the single external output terminal $TM_{OUT}$ instead of the external output terminals $TM_{OUT1}$ and $TM_{OUT2}$, the system control unit 440 is connected to the external output terminal $TM_{OUT}$ of the magnetic sensor 1, so as to receive the signal LOUT based on the signals LOUT1 and LOUT2 as the magnetic field detection result signal via the external output terminal $TM_{OUT}$.

The system control unit 440 can perform a predetermined process including operational control of the function block 430 based on the detection result signal. In other words, for example, during a magnetic field detected period of receiving the detection result signal from the magnetic sensor 1, which indicates that the south pole or the north pole is detected, the system control unit 440 determines that the cover portion 420 is in the closed state and set the PC 400 to the sleep state. In contrast, during a magnetic field non-detected period of receiving the detection result signal from the magnetic sensor 1, which indicates that the south pole and the north pole are not detected, the system control unit 440 determines that the cover portion 420 is in the opened state and set the PC 400 to the active state. In the active state, the function block 430 or the system control unit 440 performs a specific operation. In the sleep state, the specific operation is not performed, and as a result, power consumption of the function block 430, the system control unit 440, or the PC 400 in the sleep state is smaller than that in the active state. Concerning the display portion 431, the system control unit 440 turns off the backlight of the display portion 431 and stops the image display operation of the display portion 431 during the magnetic field detected period, while it turns on the backlight of the display portion 431 and performs the image display operation of the display portion 431 during the magnetic field non-detected period.

It is clear from the above description in the basic example that the magnetic sensor 1 controls the unit operations to be performed in the magnetic sensor 1 in accordance with the method described above in the basic example and the like without depending on control by the system control unit 440. Therefore, without putting any load on the system control unit 440, the single magnetic sensor 1 can realize lower power consumption of itself.

Fifth Example

Figure 21:
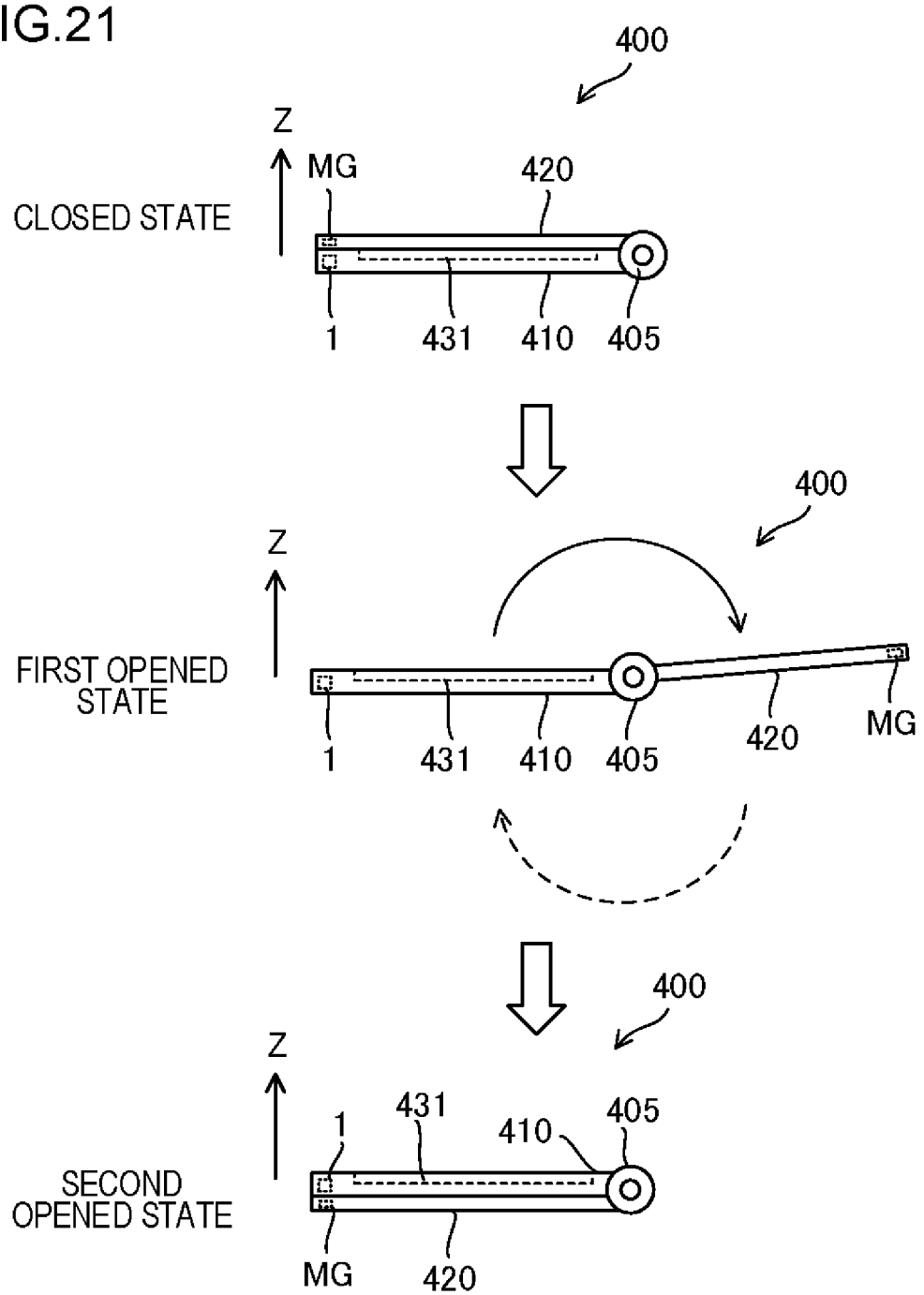
FIG. 21 is a diagram illustrating that the cover of the PC according to a fifth example of the present invention can be one of the closed state, a first opened state, and a second opened state.

A fifth example is described. In the fourth example, as illustrated in FIG. 21, the PC 400 may be structured in such a manner that the cover portion 420 can take a first opened state or a second opened state as the opened state. When the cover portion 420 in the closed state as the start point is rotated about the hinge portion 405 by approximately 360 degrees, it becomes the second opened state, and an intermediate state between the closed state and the second opened state can be considered as the first opened state. In the second opened state, the cover portion 420 is positioned to contact with the rear surface of the main body portion 410, and in this state, the magnet MG of the cover portion 420 and the magnetic sensor 1 of the main body portion 410 face each other. As a result, the PC 400 can be configured in such a manner that the south pole or the north pole is detected in the unit operation of the magnetic sensor 1 based on the magnetic field of the magnet MG not only in the closed state of the cover portion 420 but also in the second opened state of the cover portion 420.

The magnet MG is preferably configured in such a manner that one of the south pole and the north pole is detected in the closed state, and that the other pole out of the south pole and the north pole is detected in the second opened state. In this way, the system control unit 440 can distinguish between the closed state and the second opened state based on the output signals LOUT1 and LOUT2 of the magnetic sensor 1. When the cover portion 420 is in the first opened state, the distance between the magnet MG and the Hall element 10 of the magnetic sensor 1 becomes larger than that in the closed state or in the second opened state, and hence neither the south pole nor the north pole is detected in the unit operation of the magnetic sensor 1. The system control unit 440 determines that the cover portion 420 is in the closed state when one of the poles is detected and sets the PC 400 to the sleep state, and otherwise it sets the PC 400 to the active state.

Supposing that the user sets the cover portion 420 to the second opened state for using the PC 400, it is expected that both the south pole detection operation and the north pole detection operation are performed in the unit operation only during a transition period between the closed state and the second opened state. The total transition period is considered to be a few minutes at most per day, and hence in most period, power consumption of the magnetic sensor 1 can be reduced to half of that in the conventional method of FIG. 23.

Sixth Example

A sixth example is described. If the PC 400 described above in fourth example can take one of the closed state, the first opened state, and the second opened state, similarly to the fifth example (see FIG. 21), it may be configured as follows.

Figure 22A:
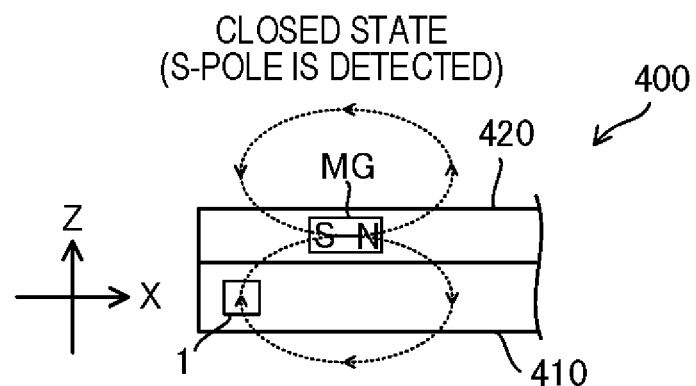
FIGS. 22A and 22B are diagrams for explaining an arrangement method of the magnet in the cover of the PC according to a sixth example of the present invention.
Figure 22B:
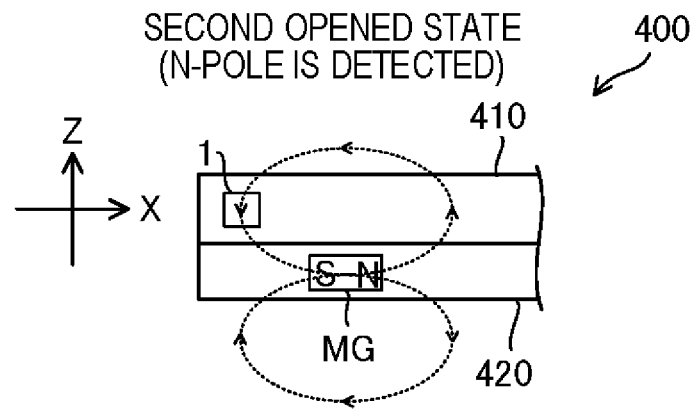

FIGS. 22A and 22B are transparent views of a part of the PC 400 according to the sixth example. FIG. 22A is a transparent view in the closed state, while FIG. 22B is a transparent view in the second opened state.

The magnetic sensor 1 and the magnet MG are arranged as follows in the PC 400 according to the sixth example. Specifically, positions of the magnetic sensor 1 and the magnet MG are shifted from each other in the X axis perpendicular to the Z axis while the direction connecting the north pole and the south pole of the magnet MG is parallel to the X axis in the closed state and in the second opened state of the PC 400, so that the magnetic sensor 1 detects one of the south pole and the north pole (the south pole in the example of FIG. 22A) in the closed state, and that the magnetic sensor 1 detects the other pole out of the south pole and the north pole (the north pole in the example of FIG. 22B) in the second opened state.

In the example illustrated in FIGS. 22A and 22B, focusing on a positional relationship in the X axis direction, in the closed state and in the second opened state of the PC 400, the magnet MG is positioned on the positive side of the X axis viewed from the magnetic sensor 1, and the north pole of the magnet MG is positioned on the positive side of the south pole in the X axis direction. In addition, focusing on a positional relationship in the Z axis direction, in the closed state of the PC 400, the magnet MG is positioned on the positive side of the Z axis viewed from the magnetic sensor 1, while in the second opened state of the PC 400, the magnet MG is positioned on the negative side of the Z axis viewed from the magnetic sensor 1.

Then, as illustrated in FIG. 22A, in the closed state of the PC 400, among magnetic force lines from the north pole of the magnet MG some magnetic force lines that interlink with the Hall element 10 of the magnetic sensor 1 and return to the south pole of the magnet MG interlink with the Hall element 10 from the negative side of the Z axis to the positive side of the Z axis (the Hall element 10 is not shown in FIG. 22A). Therefore, in the closed state of the PC 400, the magnetic sensor 1 determines presence of detection of the south pole (becomes equivalent to the state of FIG. 1B).

On the contrary, as illustrated in FIG. 22B, in the second opened state of the PC 400, among magnetic force lines from the north pole of the magnet MG some magnetic force lines that interlink with the Hall element 10 of the magnetic sensor 1 and return to the south pole of the magnet MG interlink with the Hall element 10 from the positive side of the Z axis to the negative side of the Z axis (the Hall element 10 is not shown in FIG. 22B). Therefore, in the second opened state of the PC 400, the magnetic sensor 1 determines presence of detection of the north pole (becomes equivalent to the state of FIG. 1C).

The technique described above in the sixth example can be expressed as follows.

The cover portion 420 is attached to the main body portion 410 in an openable and closable manner to be one of the closed state, the first opened state, and the second opened state with respect to the main body portion 410. The closed state, the first opened state, or the second opened state of the cover portion 420, which define positional relationships between the main body portion 410 and the cover portion 420, can also be understood to be the closed state, the first opened state, or the second opened state of the PC 400.

The main body portion 410 including a case having a schematically rectangular solid shape or a plate-like shape has a first surface and a second surface of the case, which are oppose to each other. The first surface functions as a front surface of the main body portion 410, and the second surface functions as a rear surface of the main body portion 410. The direction connecting the first surface and the second surface of the main body portion 410 is parallel to the Z axis. The first surface of the main body portion 410 is provided with the display portion 431 having the display screen. When the cover portion 420 is in the closed state, the display screen is covered with the cover portion 420 so that a user cannot see the display screen and cannot operate a touch panel for input by touching the display screen. In contrast, when the cover portion 420 is in the first opened state or in the second opened state, the user can see the display screen and can operate the touch panel.

In the closed state the cover portion 420 is set at a position opposed to the first surface of the main body portion 410, while in the second opened state the cover portion 420 is set at a position opposed to the second surface of the main body portion 410. Therefore, in the closed state, a distance between the first surface of the main body portion 410 and the cover portion 420 becomes smaller than a distance between the second surface of the main body portion 410 and the cover portion 420. In the second opened state, the distance between the second surface of the main body portion 410 and the cover portion 420 becomes smaller than the distance between the first surface of the main body portion 410 and the cover portion 420.

As understood from a relationship between the Hall element 10 of the magnetic sensor 1 and the Z axis in the PC 400, the Hall element 10 outputs a signal corresponding to a magnetic field in the direction connecting the first surface and the second surface of the main body portion 410 (i.e. outputs a signal corresponding to a magnetic field component that is applied to the Hall element 10 and is parallel to the Z axis). Further, as described above, the magnet MG of the cover portion 420 is disposed so that the magnetic sensor 1 detects the magnetic field of one polarity in the closed state of the cover portion 420, and that the magnetic sensor 1 detects the magnetic field of the other polarity in the second opened state of the cover portion 420 (one polarity and the other polarity are the south pole and the north pole, respectively, but they may be opposite). In order to realize this, the position and direction of the magnet MG are determined so that the direction connecting the north pole and the south pole of the magnet MG is perpendicular to the direction connecting the first surface and the second surface (i.e. is parallel to the X axis) in the closed state and in the second opened state of the cover portion 420, and that positions of the magnetic sensor 1 and the magnet MG are shifted from each other in the direction perpendicular to the direction connecting the first surface and the second surface (i.e. in the X axis direction).

In addition, a distance between the magnetic sensor 1 and the magnet MG in the first opened state is larger than a distance between the magnetic sensor 1 and the magnet MG in the closed state and is larger than a distance between the magnetic sensor 1 and the magnet MG in the second opened state. Thus, the magnetic sensor 1 detects neither the south pole magnetic field nor the north pole magnetic field based on the magnetic field generated by the magnet MG in the first opened state. It may be understood that the distance between the magnetic sensor 1 and the magnet MG means a distance between the Hall element 10 and the magnet MG in a strict sense. The first opened state is a state that is not classified to either the closed state or the second opened state, and the cover portion 420 becomes the first opened state in the process in which the cover portion 420 changes between the closed state and the second opened state. It may be understood that the first opened state corresponds to a state that is neither the closed state nor the second opened state, and corresponds to a state in which the magnetic sensor 1 detects neither the south pole magnetic field nor the north pole magnetic field based on the magnetic field generated by the magnet MG.

As described above in the fourth example, the system control unit 440 (see FIG. 20) can perform a predetermined process including operational control of the function block 430 based on a detection result signal from the magnetic sensor 1. In other words, for example, during the first magnetic field detected period of receiving the detection result signal from the magnetic sensor 1, which indicates that the one magnetic field (the south pole in this example) is detected, the system control unit 440 determines that the cover portion 420 is in the closed state and sets the PC 400 to the sleep state. In contrast, during the magnetic field non-detected period of receiving the detection result signal from the magnetic sensor 1, which indicates that neither the south pole nor the north pole is detected, the system control unit 440 determines that the cover portion 420 is in the first opened state and sets the PC 400 to the active state. Further, during the second magnetic field detected period of receiving the detection result signal from the magnetic sensor 1, which indicates that the other magnetic field (the north pole in this example) is detected, the system control unit 440 determines that the cover portion 420 is in the second opened state and sets the PC 400 to the active state. The sleep state and the active state are described above in the fourth example.

Note that if the PC 400 is configured to be able to take the second opened state and if the single magnet MG is disposed in the cover portion 420 so that the direction connecting the north pole and the south pole of the magnet MG is parallel to the Z axis, it may be possible to prepare a structure in which the north pole or the south pole of the magnet MG is detected by the magnetic sensor 1 only in the closed state out of the closed state and the second opened state. For instance, it may be possible to dispose a magnetic shield material in the cover portion 420 so as to prevent the magnetic field of the magnet MG from interlinking with the magnetic sensor 1 (Hall element 10) in the second opened state. Otherwise, for example, it may be possible to determine a position of the magnet MG in the cover portion 420 so that the distance between the magnet MG and the magnetic sensor 1 in the second opened state is larger than the distance between the magnet MG and the magnetic sensor 1 in the closed state, and thus the north pole or the south pole of the magnet MG is not detected by the magnetic sensor 1 in the second opened state.

Seventh Example

A seventh example is described. Between the control circuit 80 and the Hall element 10 as a magnetoelectric conversion element that converts an applied magnetic field into an electric signal, there is disposed a detection block (detection circuit) that can distinguish and detect the south pole magnetic field and the north pole magnetic field using the output signal of the Hall element 10. Further, in the basic example, power supplies to the magnetoelectric conversion element and the detection block are all stopped in the period in which the unit operation is not performed, but it may be possible to stop only a part of power supplies to the magnetoelectric conversion element and the detection block.

For instance, it may be possible that in a part or the whole of the period in which the unit operation is not performed, the power supply voltage VDD is supplied to the series circuit of the voltage dividing resistors in the reference voltage generating circuit so that the reference voltages VREF1 and VREF2 are generated.

Eighth Example

An eighth example is described. Although an example of a circuit structure and operation of the magnetic sensor that can cancel the element offset voltage of the Hall element and the input offset voltage of the amplifying circuit is described above, the magnetic sensor according to the present invention can have any circuit structure and operation as long as the south pole and the north pole magnetic fields can be distinguished and detected. Other known circuit structure and operation that can distinguish and detect the south pole and the north pole magnetic field may be applied to the present invention.

The embodiment of the present invention can be variously and appropriately modified within the scope of the technical concept described in the claims. The embodiment described above is merely an example of the embodiment of the present invention, and meanings of terms of the present invention and structural elements are not limited to those described in the above embodiment. The specific numerical values described in the above description are merely examples, and as a matter of course, they can be changed to various numerical values.

What is claimed is:

1. An electric device comprising:
a semiconductor device including a magnetic sensor; and
a post-stage device connected to the semiconductor device,
wherein the magnetic sensor includes:
 a magnetoelectric conversion element arranged to output a signal corresponding to an applied magnetic field; and
 a signal processing circuit including a detection circuit and a control circuit, the detection circuit being arranged to distinguish and detect a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity, wherein:
 the signal processing circuit is operable to perform a unit operation repeatedly at an interval, the unit operation including at least one of the first detection operation and the second detection operation, and to control content of (i+1)th unit operation in accordance with a detection result of the magnetic field in i-th unit operation (i is a natural number), and wherein:
 the magnetic sensor is formed using an integrated circuit,
 the semiconductor device is operable to output to the post-stage device a detection result signal based on a detection result of a magnetic field in each unit operation,
 the post-stage device is operable to perform a predetermined process based on the detection result signal, and
 the signal processing circuit in the semiconductor device is operable to control content of the (i+1)th unit operation according to the detection result of the magnetic field in the i-th unit operation without depending on control by the post-stage device.

2. A magnetic sensor comprising:
a magnetoelectric conversion element arranged to output a signal corresponding to an applied magnetic field; and
a signal processing circuit including a detection circuit and a control circuit, the detection circuit being arranged to distinguish and detect a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity, wherein:
the signal processing circuit is operable to perform a unit operation repeatedly at an interval, the unit operation including at least one of the first detection operation and the second detection operation, and to control content of (i+1)th unit operation in accordance with a detection result of the magnetic field in i-th unit operation (i is a natural number),
in a case where the magnetic field having the first polarity is detected in the i-th unit operation, the signal processing circuit performs the first detection operation without first performing the second detection operation in the (i+1)th unit operation, and
if the magnetic field having the first polarity is detected in the first detection operation in the (i+1)th unit operation, the signal processing circuit does not perform the second detection operation in the (i+1)th unit operation.

3. The magnetic sensor according to claim 2, wherein in the case where the magnetic field having the first polarity is detected in the i-th unit operation, the signal processing circuit performs the first detection operation without first performing the second detection operation in the (i+1)th unit operation, and
if the magnetic field having the first polarity is detected in the first detection operation in the (i+1)th unit operation, the signal processing circuit does not perform the second detection operation in the (i+1)th unit operation, and
otherwise, the signal processing circuit performs the second detection operation after the first detection operation in the (i+1)th unit operation.

4. The magnetic sensor according to claim 2, wherein, in a case where the magnetic field having the second polarity is detected in the i-th unit operation, the signal processing circuit performs the second detection operation without first performing the first detection operation in the (i+1)th unit operation, and if the magnetic field having the second polarity is detected in the second detection operation in the (i+1)th unit operation, the signal processing circuit does not perform the first detection operation in the (i+1)th unit operation.

5. The magnetic sensor according to claim 4, wherein, in the case where the magnetic field having the second polarity is detected in the i-th unit operation, the signal processing circuit performs the second detection operation without first performing the first detection operation in the (i+1)th unit operation, and
if the magnetic field having the second polarity is detected in the second detection operation in the (i+1)th unit operation, the signal processing circuit does not perform the first detection operation in the (i+1)th unit operation, and
otherwise, the signal processing circuit performs the first detection operation after the second detection operation in the (i+1)th unit operation.

6. A semiconductor device constituting the magnetic sensor according to claim 2, wherein the magnetic sensor is formed using an integrated circuit.

7. A magnetic sensor comprising:
a magnetoelectric conversion element arranged to output a signal corresponding to an applied magnetic field; and
a signal processing circuit including a detection circuit and a control circuit, the detection circuit being arranged to distinguish and detect a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity, wherein:
the signal processing circuit is operable to perform a unit operation repeatedly at an interval, the unit operation including at least one of the first detection operation and the second detection operation, and to control content of (i+1)th unit operation in accordance with a detection result of the magnetic field in i-th unit operation (i is a natural number),
in a case where neither the magnetic field having the first polarity nor the magnetic field having the second polarity is detected in the i-th unit operation, the signal processing circuit performs one detection operation out of the first detection operation and the second detection operation without first performing another detection operation in the (i+1)th unit operation, and
if a magnetic field having a polarity corresponding to the one detection operation is detected, the signal processing circuit does not perform the other detection operation in the (i+1)th unit operation.

8. The magnetic sensor according to claim 7, wherein, in the case where neither the magnetic field having the first polarity nor the magnetic field having the second polarity is detected in the i-th unit operation, the signal processing circuit performs one detection operation out of the first detection operation and the second detection operation without first performing the other detection operation in the (i+1)th unit operation, and
if the magnetic field having the polarity corresponding to the one detection operation is detected, the signal processing circuit does not perform the other detection operation in the (i+1)th unit operation, and
otherwise, the signal processing circuit performs the other detection operation after the one detection operation in the (i+1)th unit operation.

9. A semiconductor device constituting the magnetic sensor according to claim 7, wherein the magnetic sensor is formed using an integrated circuit.

10. A magnetic sensor comprising:
a magnetoelectric conversion element arranged to output a signal corresponding to an applied magnetic field; and
a signal processing circuit including a detection circuit and a control circuit, the detection circuit being arranged to distinguish and detect a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity, wherein
the signal processing circuit is operable to perform a unit operation repeatedly at an interval, the unit operation including at least one of the first detection operation and the second detection operation, and to perform one detection operation out of the first detection operation and the second detection operation without first performing the other detection operation in each unit operation, and if a magnetic field having the corresponding polarity is detected, the signal processing circuit does not perform the other detection operation in the unit operation.

11. The magnetic sensor according to claim 10, wherein, in each unit operation, the signal processing circuit performs the one detection operation without first performing the other detection operation, and
if the corresponding magnetic field is detected, the signal processing circuit does not perform the other detection operation in the unit operation, and
if the corresponding magnetic field is not detected, the signal processing circuit performs the other detection operation after the one detection operation in the unit operation.

12. An electric device comprising:
a semiconductor device constituting the magnetic sensor according to claim 8; and
a post-stage device connected to the semiconductor device, wherein
the magnetic sensor is formed using an integrated circuit,
the semiconductor device is operable to output to the post-stage device a detection result signal based on a detection result of a magnetic field in each unit operation,
the post-stage device is operable to perform a predetermined process based on the detection result signal, and
the signal processing circuit in the semiconductor device is operable to perform one detection operation out of the first detection operation and the second detection operation without first performing the other detection operation in each unit operation, and if a magnetic field having the corresponding polarity is detected, the signal processing circuit does not perform the other detection operation without depending on control by the post-stage device in the unit operation.

13. A semiconductor device constituting the magnetic sensor according to claim 10, wherein the magnetic sensor is formed using an integrated circuit.

14. An electric device comprising:
a main body portion including the semiconductor device constituting the magnetic sensor according to claim 10;
a cover portion attached to the main body portion in an openable and closable manner so as to be in one of a closed state, a first opened state, and a second opened state with respect to the main body portion; and
a post-stage device connected to the semiconductor device, wherein
the magnetic sensor is formed using an integrated circuit,
the semiconductor device is operable to output to the post-stage device a detection result signal based on a detection result of a magnetic field in each unit operation,
the post-stage device is operable to perform a predetermined process based on the detection result signal,
the main body portion has a first surface and a second surface opposed to each other,
the cover portion is disposed at a position facing the first surface of the main body portion in the closed state, the cover portion is disposed at a position facing the second surface of the main body portion in the second opened state, and the cover portion becomes the first opened state in the process in which the cover portion moves between the closed state and the second opened state,
a magnet is disposed in the cover portion so that the magnetic sensor detects the magnetic field having the first polarity in the closed state and that the magnetic sensor detects the magnetic field having the second polarity in the second opened state, and
a distance between the magnetic sensor and the magnet in the first opened state is larger than a distance between the magnetic sensor and the magnet in the closed state as well as a distance between the magnetic sensor and the magnet in the second opened state, so that the magnetic sensor detects neither the magnetic field having the first polarity nor the magnetic field having the second polarity in the first opened state.

15. The electric device according to claim 14, wherein
the magnetoelectric conversion element of the magnetic sensor is operable to output a signal corresponding to a magnetic field in a direction connecting the first surface and the second surface, and
in the closed state and in the second opened state, a direction connecting a north pole and a south pole of the magnet is perpendicular to the direction connecting the first surface and the second surface, and positions of the magnetic sensor and the magnet are shifted from each other in a direction perpendicular to the direction connecting the first surface and the second surface.

16. An electric device comprising:
a main body portion including a semiconductor device that includes a magnetic sensor;
a cover portion attached to the main body portion in an openable and closable manner so as to be in one of a closed state, a first opened state, and a second opened state with respect to the main body portion; and
a post-stage device connected to the semiconductor device,
wherein the magnetic sensor includes:
a magnetoelectric conversion element arranged to output a signal corresponding to an applied magnetic field; and
a signal processing circuit including a detection circuit and a control circuit, the detection circuit being arranged to distinguish and detect a magnetic field having a first polarity and a magnetic field having a second polarity opposite to the first polarity by using an output signal of the magnetoelectric conversion element, the control circuit being arranged to control the detection circuit to perform a first detection operation to detect the magnetic field having the first polarity and a second detection operation to detect the magnetic field having the second polarity, wherein:
the signal processing circuit is operable to perform a unit operation repeatedly at an interval, the unit operation including at least one of the first detection operation and the second detection operation, and to control content of (i+1)th unit operation in accordance with a detection result of the magnetic field in i-th unit operation (i is a natural number),
and wherein:
the magnetic sensor is formed using an integrated circuit,
the semiconductor device is operable to output to the post-stage device a detection result signal based on a detection result of a magnetic field in each unit operation,
the post-stage device is operable to perform a predetermined process based on the detection result signal,
the main body portion has a first surface and a second surface opposed to each other,
the cover portion is disposed at a position facing the first surface of the main body portion in the closed state, the cover portion is disposed at a position facing the second surface of the main body portion in the second opened state, and the cover portion becomes the first opened state in the process in which the cover portion moves between the closed state and the second opened state,
a magnet is disposed in the cover portion so that the magnetic sensor detects the magnetic field having the first polarity in the closed state and that the magnetic sensor detects the magnetic field having the second polarity in the second opened state, and
a distance between the magnetic sensor and the magnet in the first opened state is larger than a distance between the magnetic sensor and the magnet in the closed state as well as a distance between the magnetic sensor and the magnet in the second opened state, so that the magnetic sensor detects neither the magnetic field having the first polarity nor the magnetic field having the second polarity in the first opened state.

17. The electric device according to claim 16, wherein
the magnetoelectric conversion element of the magnetic sensor outputs a signal corresponding to a magnetic field in a direction connecting the first surface and the second surface, and
in the closed state and in the second opened state, a direction connecting a north pole and a south pole of the magnet is perpendicular to the direction connecting the first surface and the second surface, and positions of the magnetic sensor and the magnet are shifted from each other in a direction perpendicular to the direction connecting the first surface and the second surface.

* * * * *